(12) United States Patent
Feng et al.

(10) Patent No.: US 11,328,651 B2
(45) Date of Patent: May 10, 2022

(54) SHIFT REGISTER FOR COMPENSATION FOR SUB-PIXLE ROW, DRIVING METHOD THEREOF, GATE DRIVING CIRCUIT AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 70 days.

(21) Appl. No.: 16/643,966

(22) PCT Filed: Dec. 18, 2018

(86) PCT No.: PCT/CN2018/121813
§ 371 (c)(1),
(2) Date: Mar. 3, 2020

(87) PCT Pub. No.: WO2020/124376
PCT Pub. Date: Jun. 25, 2020

(65) Prior Publication Data
US 2021/0225255 A1    Jul. 22, 2021
US 2022/0084455 A9    Mar. 17, 2022

(51) Int. Cl.
*G09G 3/20* (2006.01)
*G11C 19/28* (2006.01)

(52) U.S. Cl.
CPC .......... *G09G 3/2092* (2013.01); *G11C 19/28* (2013.01); *G09G 2300/0426* (2013.01); *G09G 2310/0286* (2013.01); *G09G 2310/061* (2013.01); *G09G 2310/08* (2013.01)

(58) Field of Classification Search
CPC ......... G11C 19/28; G09G 3/2092; G09G 3/20
See application file for complete search history.

(56) References Cited

U.S. PATENT DOCUMENTS

| | | | |
|---|---|---|---|
| 10,547,316 B2* | 1/2020 | Takasugi | H03K 21/18 |
| 2011/0142191 A1* | 6/2011 | Tobita | G11C 19/28 |
| | | | 377/64 |

* cited by examiner

*Primary Examiner* — Xuemei Zheng
(74) *Attorney, Agent, or Firm* — Armstrong Teasdale LLP

(57) ABSTRACT

Embodiments of the present disclosure provide a shift register. The shift register includes a blank input circuit, N shift register circuits, and a compensation selection circuit. The blank input circuit is configured to store a blank input signal, and provide a blank pull-down signal to N pull-down nodes based on the blank input signal and a blank control signal. The N shift register circuits are respectively coupled to the blank input circuit via the N pull-down nodes, and are configured to output respective blank output signals based on the blank pull-down signal and respective clock signals during a blank period. The compensation selection circuit is configured to provide the blank input signal to the blank input circuit under the control of a compensation selection control signal. Herein N is a natural number greater than 1.

19 Claims, 11 Drawing Sheets

SHIFT REGISTER FOR COMPENSATION FOR SUB-PIXLE ROW, DRIVING METHOD THEREOF, GATE DRIVING CIRCUIT AND DISPLAY DEVICE

CROSS REFERENCE TO RELATED APPLICATIONS

This patent application is a National Stage Entry of PCT/CN2018/121813 filed on Dec. 18, 2018, the disclosure of which is incorporated by reference herein in its entirety as part of the present application.

BACKGROUND

Embodiments of the present disclosure relate to the field of display technology, and more particularly, to a shift register and a drive method thereof, a gate drive circuit and a display device.

Gate Driver on Array (GOA) technology makes a gate drive circuit on an array substrate, to realize the function of scanning a pixel circuit row-by-row. The gate drive circuit may include a plurality of cascaded shift registers. A scan signal is outputted from an output terminal of the shift register to drive the pixel circuit, and a cascade signal is simultaneously outputted from an output terminal of the shift register to drive a shift register at next stage.

In the display field, especially in organic light-emitting diode (OLED) display devices, the gate drive circuits are currently integrated in the GATE IC. In the IC design, the area of the chip is the main factor affecting the cost of the chip.

BRIEF DESCRIPTION

Embodiments of the present disclosure provide a shift register and a drive method thereof, a gate drive circuit and a display device.

A first aspect of the present disclosure provides a shift register. The shift register includes a blank input circuit, N shift register circuits, and a compensation selection circuit. The blank input circuit is configured to store a blank input signal, and provide a blank pull-down signal to the N shift register circuits via N pull-down nodes based on the blank input signal and a blank control signal. The N shift register circuits are coupled to the blank input circuit, and are configured to output respective blank output signals based on the blank pull-down signal and respective clock signals during a blank period. The compensation selection circuit is configured to provide the blank input signal to the blank input circuit under the control of a compensation selection control signal. Here, N is a natural number greater than 1.

In some embodiments of the present disclosure, the N shift register circuits are further configured to output respective display output signals based on a display input signal and the respective clock signals during a display period. And one of the display output signals is provided to the compensation selection circuit as the blank input signal.

In some embodiments of the present disclosure, the blank input circuit includes a storage sub-circuit and an isolation sub-circuit. The storage sub-circuit is configured to store the blank input signal. The isolation sub-circuit is configured to provide the blank pull-down signal to the N pull-down nodes based on the blank input signal and the blank control signal.

In some embodiments of the present disclosure, the isolation sub-circuit includes a first transistor and N second transistors. A control electrode of the first transistor is coupled to the storage sub-circuit. A first electrode of the first transistor is coupled to a blank pull-down signal terminal. A second electrode of the first transistor is coupled to first electrodes of the N second transistors. Control electrodes of the N second transistors are coupled to a blank control terminal. And second electrodes of the N second transistors are coupled to the respective pull-down nodes.

In some embodiments of the present disclosure, the isolation sub-circuit includes a third transistor, a fourth transistor, and N fifth transistors. A control electrode of the third transistor is coupled to the storage sub-circuit. A first electrode of the third transistor is coupled to the blank control terminal. A second electrode of the third transistor is coupled to a second electrode of the fourth transistor and control electrodes of the N fifth transistors. A control electrode of the fourth transistor is coupled to a second blank control terminal. A first electrode of the fourth transistor is coupled to a first voltage terminal. First electrodes of the N fifth transistors are coupled to a blank pull-down signal terminal. And second electrodes of the N fifth transistors are coupled to the respective pull-down nodes.

In some embodiments of the present disclosure, the isolation sub-circuit includes a sixth transistor, two seventh transistors, and N eighth transistors. A control electrode of the sixth transistor is coupled to the storage sub-circuit. A first electrode of the sixth transistor is coupled to a blank control terminal. A second electrode of the sixth transistor is coupled to second electrodes of the two seventh transistors and control electrodes of the N eighth transistors. Control electrodes of the two seventh transistors are respectively coupled to a third blank control terminal and a fourth blank control terminal. First electrodes of the two seventh transistors are coupled to a first voltage terminal. First electrodes of the N eighth transistors are coupled to a blank pull-down signal terminal. Second electrodes of the N eighth transistors are coupled to the respective pull-down nodes.

In some embodiments of the present disclosure, the storage sub-circuit includes a first capacitor. A first terminal of the first capacitor is coupled to the compensation selection circuit and the isolation sub-circuit. A second terminal of the first capacitor is coupled to a first voltage terminal.

In some embodiments of the present disclosure, the compensation selection circuit includes a ninth transistor. A control electrode of the ninth transistor is coupled to a compensation selection control terminal. A first electrode of the ninth transistor is coupled to a blank input signal terminal. A second electrode of the ninth transistor is coupled to the isolation sub-circuit.

In some embodiments of the present disclosure, the shift register circuit includes a display input circuit, a display reset circuit, a blank reset circuit, a pull-up circuit, an output pull-up circuit, and an output circuit. The display input circuit is configured to provide a display pull-down signal to the pull-down node based on a display input signal. The display reset circuit is configured to reset the pull-down node based on a display reset signal. The blank reset circuit is configured to reset the pull-down node based on a blank reset signal. The pull-up circuit is configured to maintain a voltage level of the pull-down node after resetting the pull-down node, and alternately pull down voltage levels of the first pull-up node and the second pull-up node. The output pull-up circuit is configured to pull up a blank output signal and a display output signal of the shift register based on the voltage levels of the first pull-up node and the second pull-up node. The output circuit is configured to output the blank output signal based on the blank pull-down signal and the corresponding clock signal during the blank period, and output the display output signal based on the display pull-down signal and the corresponding clock signal during the display period.

In some embodiments of the present disclosure, the display reset circuit includes an eleventh transistor. A control electrode of the eleventh transistor is coupled to a display reset terminal. A first electrode of the eleventh transistor is coupled to a first voltage terminal. A second electrode of the eleventh transistor is coupled to the pull-down node.

In some embodiments of the present disclosure, the blank reset circuit includes a twelfth transistor. A control electrode of the twelfth transistor is coupled to a blank reset terminal. A first electrode of the twelfth transistor is coupled to a first voltage terminal. A second electrode of the twelfth transistor is coupled to the pull-down node.

In some embodiments of the present disclosure, the pull-up circuit includes thirteenth to twenty-fourth transistors. A control electrode and a first electrode of the thirteenth transistor are coupled to the first control terminal. A second electrode of the thirteenth transistor is coupled to a first pull-up node. A control electrode of the fourteenth transistor is coupled to the pull-down node. A first electrode of the fourteenth transistor is coupled to a first voltage terminal. A second electrode of the fourteenth transistor is coupled to the first pull-up node. A control electrode of the fifteenth transistor is coupled to the first pull-up node. A first electrode of the fifteenth transistor is coupled to the first voltage terminal. A second electrode of the fifteenth transistor is coupled to the pull-down node. A control electrode of the sixteenth transistor is coupled to a blank control terminal. A first electrode of the sixteenth transistor is coupled to a second electrode of the seventeenth transistor. A second electrode of the sixteenth transistor is coupled to the first pull-up node. A control electrode of the seventeenth transistor is coupled to a pull-down control node. A first electrode of the seventeenth transistor is coupled to the first voltage terminal. A control electrode of the eighteenth transistor is coupled to a display input terminal. A first electrode of the eighteenth transistor is coupled to the first voltage terminal. A second electrode of the eighteenth transistor is coupled to the first pull-up node. A control electrode and a first electrode of the nineteenth transistor are coupled to a second control terminal. A second electrode of the nineteenth transistor is coupled to a second pull-up node. A control electrode of the twentieth transistor is coupled to the pull-down node. A first electrode of the twentieth transistor is coupled to the first voltage terminal. A second electrode of the twentieth transistor is coupled to the second pull-up node. A control electrode of the twenty-first transistor is coupled to the second pull-up node. A first electrode of the twenty-first transistor is coupled to the first voltage terminal. A second electrode of the twenty-first transistor is coupled to the pull-down node. A control electrode of the twenty-second transistor is coupled to the blank control terminal. A first electrode of the twenty-second transistor is coupled to a second electrode of the twenty-third transistor. A second electrode of the twenty-second transistor is coupled to the second pull-up node. A control electrode of a twenty-third transistor is coupled to the pull-down control node. A first electrode of the twenty-third transistor is coupled to the first voltage terminal. A control electrode of the twenty-fourth transistor is coupled to the display input terminal. A first electrode of the twenty-fourth transistor is coupled to the first voltage terminal. A second electrode of the twenty-fourth transistor is coupled to the second pull-up node.

In some embodiments of the present disclosure, the pull-up circuit includes thirteenth to sixteenth transistors, eighteenth to twenty-second transistors, and a twenty-fourth transistor. A control electrode and a first electrode of the thirteenth transistor are coupled to a first control terminal. A second electrode of the thirteenth transistor is coupled to a first pull-up node. A control electrode of the fourteenth transistor is coupled to the pull-down node. A first electrode of the fourteenth transistor is coupled to the first voltage terminal. A second electrode of the fourteenth transistor is coupled to the first pull-up node. A control electrode of the fifteenth transistor is coupled to the first pull-up node. A first electrode of the fifteenth transistor is coupled to the first voltage terminal. A second electrode of the fifteenth transistor is coupled to the pull-down node. A control electrode of the sixteenth transistor is coupled to the blank control terminal. A first electrode of the sixteenth transistor is coupled to the first voltage terminal. A second electrode of the sixteenth transistor is coupled to the first pull-up node. A control electrode of the eighteenth transistor is coupled to the display input terminal. A first electrode of the eighteenth transistor is coupled to the first voltage terminal. A second electrode of the eighteenth transistor is coupled to the first pull-up node. A control electrode and a first electrode of the nineteenth transistor are coupled to a second control terminal. A second electrode of the nineteenth transistor is coupled to a second pull-up node. A control electrode of the twentieth transistor is coupled to the pull-down node. A first electrode of the twenty-first transistor is coupled to the first voltage terminal. A second electrode of the twenty-first transistor is coupled to the pull-down node. A control electrode of the twenty-second transistor is coupled to the blank control terminal. A first electrode of the twenty-second transistor is coupled to the first voltage terminal. A second electrode of the twenty-second transistor is coupled to the second pull-up node. A control electrode of the twenty-fourth transistor is coupled to the display input terminal. A first electrode of the twenty-fourth transistor is coupled to the first voltage terminal. A second electrode of the twenty-fourth transistor is coupled to the second pull-up node.

In some embodiments of the present disclosure, the pull-up circuit includes thirteenth to fifteenth transistors, eighteenth to twenty-first transistors, and a twenty-fourth transistor. A control electrode and a first electrode of the thirteenth transistor are coupled to a first control terminal. A second electrode of the thirteenth transistor is coupled to a first pull-up node. A control electrode of the fourteenth transistor is coupled to the pull-down node. A first electrode of the fourteenth transistor is coupled to the first pull-up node. A second electrode of the fourteenth transistor is coupled to the first pull-up node. A control electrode of the fifteenth transistor is coupled to the first pull-up node. A first electrode of the fifteenth transistor is coupled to the first voltage terminal. A second electrode of the fifteenth transistor is coupled to the pull-down node. A control electrode of the eighteenth transistor is coupled to the display input terminal. A first electrode of the eighteenth transistor is coupled to the first voltage terminal. A second electrode of the eighteenth transistor is coupled to the first pull-up node. A control electrode and a first electrode of the nineteenth transistor are coupled to a second control terminal. A second electrode of the nineteenth transistor is coupled to a second pull-up node. A control electrode of the twentieth transistor is coupled to the pull-down node. A first electrode of the twentieth transistor is coupled to the first voltage terminal. A second electrode of the twentieth transistor is coupled to the second pull-up node. A control electrode of a twenty-first transistor is coupled to the second pull-up node. A first electrode of the twenty-first transistor is coupled to the first voltage terminal. A second electrode of the twenty-first transistor is coupled to the pull-down node. A control electrode of the twenty-fourth transistor is coupled to the display input terminal. A first electrode of the twenty-fourth transistor is coupled to the first voltage terminal. A second electrode of the twenty-fourth transistor is coupled to the second pull-up node.

In some embodiments of the present disclosure, the output pull-up circuit includes twenty-fifth to twenty-eighth transistors. A control electrode of the twenty-fifth transistor is coupled to the first pull-up node. A first electrode of the twenty-fifth transistor is coupled to a first voltage terminal. A second electrode of the twenty-fifth transistor is coupled to a shift signal output terminal. A control electrode of the twenty-sixth transistor is coupled to the first pull-up node. A first electrode of the twenty-sixth transistor is coupled to the first voltage terminal. A second electrode of the twenty-sixth transistor is coupled to a first pixel signal output terminal. A control electrode of the twenty-seventh transistor is coupled to the second pull-up node. A first electrode of the twenty-seventh transistor is coupled to the first voltage terminal. A second electrode of the twenty-seventh transistor is coupled to the shift signal output terminal. A control electrode of the twenty-eighth transistor is coupled to the second pull-up node. A first electrode of the twenty-eighth transistor is coupled to the first voltage terminal. A second electrode of the twenty-eighth transistor is coupled to the first pixel signal output terminal. The output circuit includes a twenty-ninth transistor, a thirtieth transistor, and a second capacitor. A control electrode of the twenty-ninth transistor is coupled to the pull-down node. A first electrode of the twenty-ninth transistor is coupled to a first clock signal terminal. A second electrode of the twenty-ninth transistor is coupled to the shift signal output terminal. A control electrode of the thirtieth transistor is coupled to the pull-down node. A first electrode of the thirtieth transistor is coupled to the first clock signal terminal. A second electrode of the thirtieth transistor is coupled to the first pixel signal output terminal.

In some embodiments of the present disclosure, the output pull-up circuit further includes a thirty-first transistor and a thirty-second transistor. A control electrode of the thirty-first transistor is coupled to the first pull-up node. A first electrode of the thirty-first transistor is coupled to the first voltage terminal. A second electrode of the thirty-first transistor is coupled to a second pixel signal output terminal. A control electrode of thirty-second transistor is coupled to the second pull-up node. A first electrode of the thirty-second transistor is coupled to the first voltage terminal. A second electrode of the thirty-second transistor is coupled to the second pixel signal output terminal. The output circuit further includes a thirty-third transistor and a third capacitor. A control electrode of the thirty-third transistor is coupled to the pull-down node. A first electrode of the thirty-third transistor is coupled to a second clock signal terminal. A second electrode of the thirty-third transistor is coupled to the second pixel signal output terminal. A first terminal of the third capacitor is coupled to the pull-down node. A second terminal of the third capacitor is coupled to the second pixel signal output terminal.

In some embodiments of the present disclosure, the display input circuit includes a tenth transistor. A control electrode of the tenth transistor is coupled to a display input terminal. A first electrode of the tenth transistor is coupled to a display pull-down signal terminal. A second electrode of the tenth transistor is coupled to the pull-down node.

In some embodiments of the present disclosure, the display input circuit includes a thirty-fourth transistor and a thirty-fifth transistor. A control electrode and a first electrode of the thirty-fourth transistor are coupled to the display input terminal. A second electrode of the thirty-fourth transistor is coupled to a first electrode of the thirty-fifth transistor. A control electrode of the thirty-fifth transistor is coupled to the display input terminal. A second electrode of the thirty-fifth transistor is coupled to the pull-down node.

In some embodiments of the present disclosure, the display input circuit includes a thirty-sixth transistor and a thirty-seventh transistor. A control electrode of the thirty-sixth transistor is coupled to the display input terminal. A first electrode of the thirty-sixth transistor is coupled to the display pull-down signal terminal. A second electrode of the thirty-sixth transistor is coupled to a control electrode and a first electrode of the thirty-seventh transistor. A second electrode of the thirty-seventh transistor is coupled to the pull-down node.

In some embodiments of the present disclosure, the display input circuit includes a thirty-eighth transistor. A control electrode and a first electrode of the thirty-eighth transistor are coupled to the display input terminal. A second electrode of the thirty-eighth transistor is coupled to the pull-down node.

A second aspect of the present disclosure provides a gate drive circuit. The gate drive circuit includes K cascaded shift registers according to the first aspect of the present disclosure. A compensation selection control terminal of the shift register at each stage is provided with a compensation selection control signal. A blank control terminal of the shift register at each stage is provided with a blank control signal. A display input terminal of a first shift register circuit of K×N shift register circuits is provided with a start signal. A display reset terminal of the first shift register circuit is coupled to a shift signal output terminal of a $(i/2+2)^{th}$ shift register circuit. A first clock signal terminal of the first shift register circuit is provided with a first clock signal. The display input terminal of a second shift register circuit is provided with the start signal. The display reset terminal of the second shift register circuit is coupled to the shift signal output terminal of a $(i/2+3)^{th}$ shift register circuit. The first clock signal terminal of the second shift register circuit is provided with a second clock signal. The display input terminal of an $n^{th}$ shift register circuit is coupled to the shift signal output terminal of a $(n-i/2)^{th}$ shift register circuit. The display reset terminal of the $n^{th}$ shift register circuit is coupled to the shift signal output terminal of a $(n+i/2+1)^{th}$ shift register circuit. The first clock signal terminal of the $n^{th}$ shift register circuit is provided with an $M^{th}$ clock signal. During a display period, the gate drive circuit is provided with a first to an $i^{th}$ clock signals. The first to the $i^{th}$ clock signals have a same clock cycle. The clock cycle includes i phases with an equal duration. The first to the $i^{th}$ clock signals are sequentially phase shifted by 1/i clock cycle. Here K is a natural number greater than 1, i is an even number, and n is a natural number greater than 2 and less than or equal to K×N. If n equals to an integer multiple of i, M=i; otherwise, M=(n mod i).

In some embodiments of the present disclosure, N equals to four.

In some embodiments of the present disclosure, i equals to 4.

In some embodiments of the present disclosure, a second clock signal terminal of the $n^{th}$ shift register circuit is provided with a $(i+M)^{th}$ clock signal. During the display period, the $(i+1)^{th}$ to $2i^{th}$ clock signals have the same waveforms as the first to $i^{th}$ clock signals respectively.

A third aspect of the present disclosure provides a drive method for driving a shift register according to the first aspect of the present disclosure. The drive method includes during a display period, providing the blank input signal to the blank input circuit based on a compensation selection signal, and storing the blank input signal in the blank input circuit, and during a blank period, providing a blank pull-down signal to the N pull-down nodes based on the stored blank input signal and a blank control signal, such that the N shift register circuits output respective blank output signals based on the blank pull-down signal and respective clock signals.

In some embodiments of the present disclosure, the drive method further includes during the display period, providing a display pull-down signal to the respective pull-down nodes based on a display input signal, and outputting respective display output signals based on voltage levels of the pull-down nodes and the respective clock signals.

A fourth aspect of the present disclosure provides an array substrate. The array substrate includes the gate drive circuit according to the second aspect of the present disclosure.

A fifth aspect of the present disclosure provides a display device. The display device includes the array substrate according to the fourth aspect of the present disclosure.

BRIEF DESCRIPTION OF THE DRAWINGS

To describe technical solutions of the embodiments of the present disclosure more clearly, the accompanying drawings of the embodiments will be briefly introduced in the following. It should be known that the accompanying drawings in the following description merely involve some embodiments of the present disclosure, but do not limit the present disclosure, in which.

DETAILED DESCRIPTION

To make the technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protecting scope of the present disclosure.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all the embodiments of the present disclosure, a source and a drain (an emitter and a collector) of a transistor are symmetrical, and a current from the source to the drain (from the emitter to the collector) to turn on an N-type transistor is in an opposite direction with respect to the current from the source to the drain (from the emitter and the collector) to turn on an a P-type transistor. Therefore, in the embodiments of the present disclosure, a controlled intermediate terminal of the transistor is referred to as a control electrode, a signal input terminal is referred to as a first electrode, and a signal output terminal is referred to as a second electrode. The transistors used in the embodiments of the present disclosure mainly are switching transistors. In addition, terms such as "first" and "second" are only used to distinguish one element (or a part of the element) from another element (or another part of this element).

Figure 1:
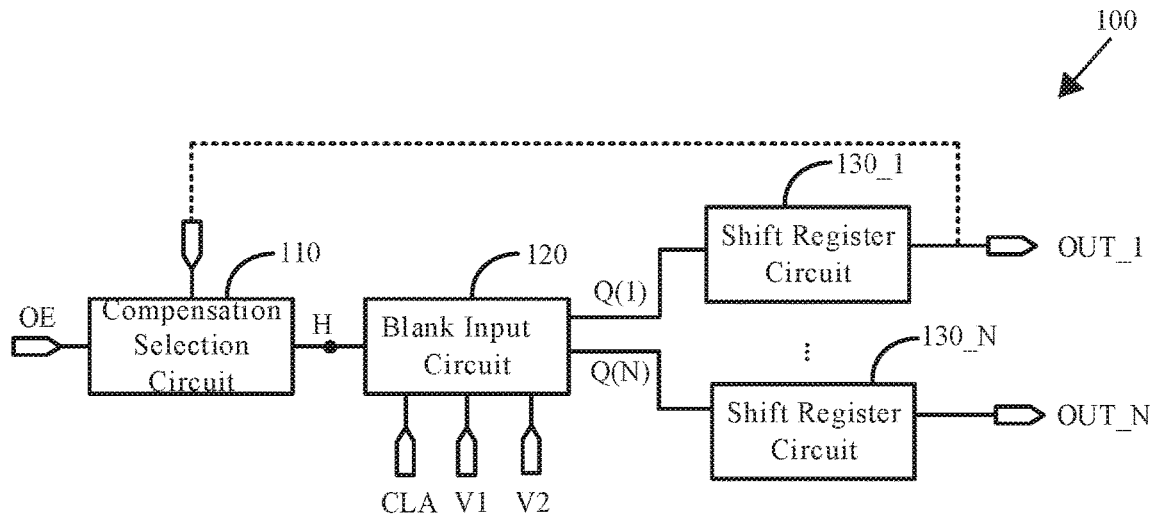
FIG. 1 is a schematic block diagram of a shift register according to an embodiment of the present disclosure.

FIG. 1 shows a schematic block diagram of a shift register 100 according to an embodiment of the present disclosure. The shift register 100 includes a blank input circuit 120, N shift register circuits (130_1 ... 130_n, collectively referred to as 130, hereinafter) and a compensation selection circuit 110. The blank input circuit 120 is configured to store a blank input signal OUT_1, and provide a blank pull-down signal V2 to the N shift register circuits 130 via N pull-down nodes (Q(1)~Q(N)) based on the blank input signal OUT_1 and a blank control signal CLA. The N shift register circuits 130 are coupled to the blank input circuit 120, and are configured to output respective blank output signals (OUT_1~OUT_N) based on the blank pull-down signal V2 and respective clock signals (not shown) during a blank period. The compensation selection circuit 110 is configured to provide the blank input signal OUT_1 to the blank input circuit 120 under the control of a compensation selection control signal OE. Here, N is a natural number greater than 1.

The shift register circuit 130 may be further configured to output respective display output signals based on a display input signal (not shown) and the respective clock signals during a display period. One of the display output signals may be provided to the compensation selection circuit 110 as a blank input signal.

In this way, one compensation selection circuit 110 and one blank input circuit 120 can provide the blank pull-down signal V2 to the N pull-down nodes (Q(1) to Q(N)). Compared with the case where one compensation selection circuit 110 and one blank input circuit 120 can only provide the blank pull-down signal V2 to one pull-down node, the embodiments of the present disclosure can reduce the amount of the compensation selection circuit 110 and the blank input circuit 120 in the gate drive circuit.

Figure 2:
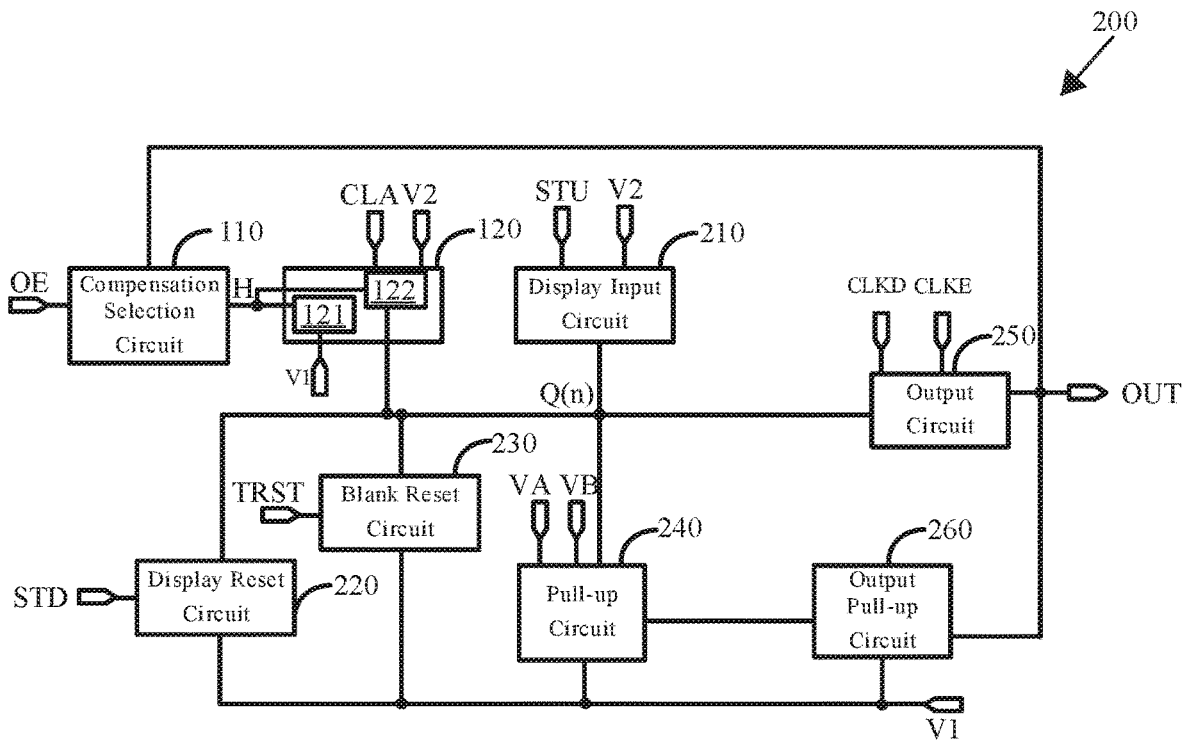
FIG. 2 is a schematic block diagram of a shift register according to another embodiment of the present disclosure.

FIG. 2 illustrates a schematic block diagram of the shift register 200 according to another embodiment of the present disclosure. As shown in FIG. 2, the blank input circuit 120 may include a storage sub-circuit 121 and an isolation sub-circuit 122. The storage sub-circuit 121 is configured to store the blank input signal OUT. The isolation sub-circuit 122 is configured to provide the blank pull-down signal V2 to the respective pull-down node Q(n) based on the blank input signal OUT and the blank control signal CLA.

FIGS. 3-6 illustrate schematic circuit diagrams of the compensation selection circuit 110 and the blank input circuit 120 of the shift register (100 and 200) according to an embodiment of the present disclosure. In the embodiment of the present disclosure, P-type transistors are used to implement the compensation selection circuit 110 and the blank input circuit 120. Hereinafter, the first voltage V1 is at a high level. The second voltage V2 is at a low level. N is 4, for example. Those skilled in the art should understand that in alternative embodiments of the present disclosure, N-type transistors may also be used to implement the compensation selection circuit 110 and the blank input circuit 120.

Figure 3:
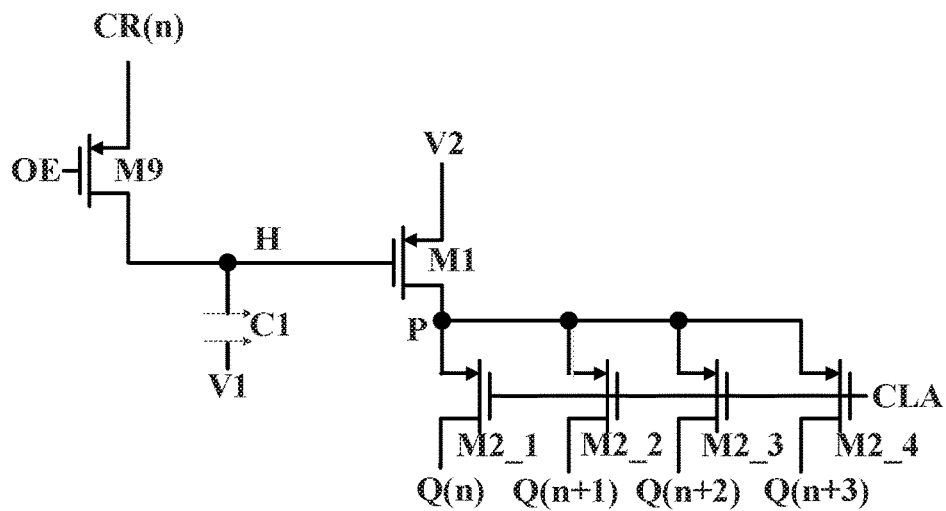
FIG. 3 is a schematic circuit diagram of a compensation selection circuit and a blanking input circuit of the shift register according to an embodiment of the present disclosure.

As shown in FIG. 3, the compensation selection circuit 110 may include a ninth transistor M9. The storage sub-circuit 121 may include a first capacitor C1. The isolation sub-circuit 122 may include a first transistor M1 and four second transistors (M2_1, M2_2, M2_3, and M2_4).

A control electrode of the ninth transistor M9 is coupled to the compensation selection control terminal OE. A first electrode of the ninth transistor M9 is coupled to the blank input signal terminal. The blank input signal terminal may be, for example, a shift signal output terminal CR(n) of the shift register. A second electrode of the ninth transistor M9 is coupled to the pull-down control node H. A first terminal of the first capacitor C1 is coupled to the pull-down control node H. A second terminal of the first capacitor C1 is coupled to a first voltage terminal V1. A control electrode of the first transistor M1 is coupled to the pull-down control node H. A first electrode of the first transistor M1 is coupled to the blank pull-down signal terminal. The blank pull-down signal terminal may be provided with, for example, the second voltage V2. A second electrode of the first transistor M1 is coupled to the first electrodes (node P) of the four second transistors (M2_1, M2_2, M2_3, and M2_4). The control electrodes of the four second transistors (M2_1, M2_2, M2_3, and M2_4) are coupled to the blank control terminal CLA. The second electrodes of the four second transistors (M2_1, M2_2, M2_3, and M2_4) are coupled to respective pull-down nodes (Q(n)-Q(n+3)). When the blank control terminal CLA is provided with a low voltage level, the four second transistors (M2_1, M2_2, M2_3, and M2_4) are enabled, thereby providing the blank pull-down signal V2 from the blank pull-down signal terminal to the four pull-down nodes (Q(n) to Q(n+3)).

Figure 4:
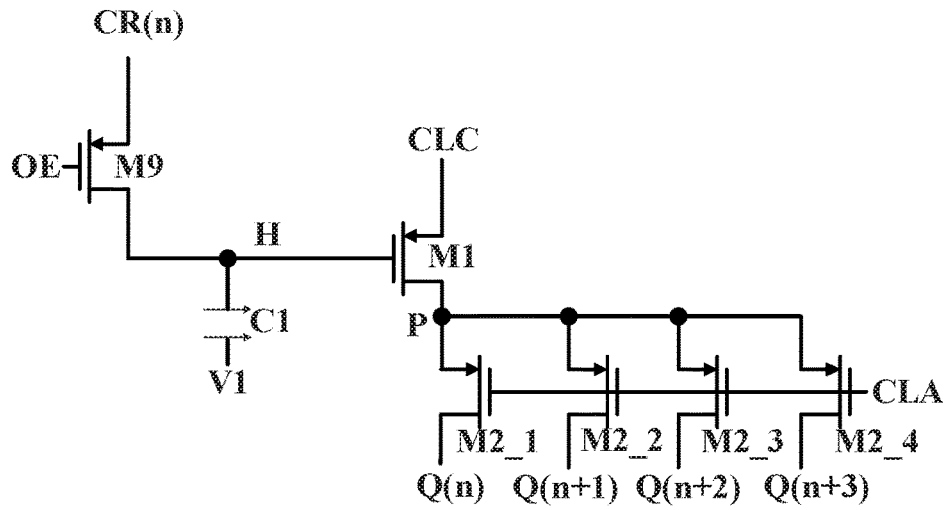
FIG. 4 is a schematic circuit diagram of a compensation selection circuit and a blanking input circuit of the shift register according to another embodiment of the present disclosure.

The difference between the isolation sub-circuit 122 as shown in FIG. 4 and the isolation sub-circuit 122 as shown in FIG. 3 is that the signal CLC provided to the blank pull-down signal terminal does not need to be kept at the low level all the time, it only needs to be at the low level when the blank control signal CLA from the blank control terminal CLA is at the low level. When the blank control terminal CLA is provided with the low voltage level, the four second transistors (M2_1, M2_2, M2_3, and M2_4) are enabled, thereby providing the low voltage level from the blank pull-down signal terminal to the four pull-down nodes (Q(n) to Q(n+3)).

Figure 5:
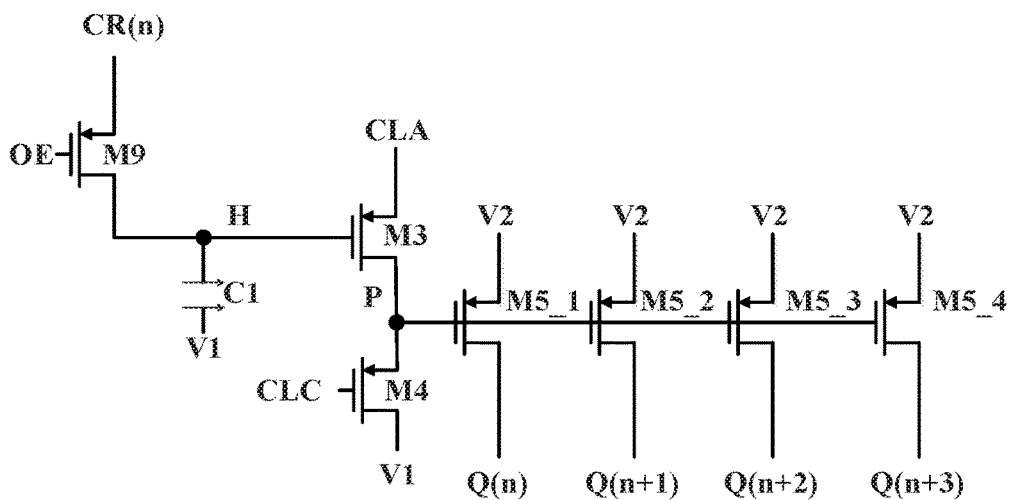
FIG. 5 is a schematic circuit diagram of a compensation selection circuit and a blanking input circuit of the shift register according to still another embodiment of the present disclosure.

FIG. 5 illustrates another exemplary structure of the isolation sub-circuit 122. As shown in FIG. 5, the isolation sub-circuit 122 may include a third transistor M3, a fourth transistor M4, and four fifth transistors (M5_1, M5_2, M5_3, and M5_4). A control electrode of the third transistor M3 is coupled to the pull-down control node H. A first electrode of the third transistor M3 is coupled to the blank control terminal CLA. A second electrode of the third transistor M3 is coupled to a second electrode of the fourth transistor M4 and the control electrodes (node P) of the four fifth transistors (M5_1, M5_2, M5_3, and M5_4). A control electrode of the fourth transistor M4 is coupled to the second blank control terminal CLC. A first electrode of the fourth transistor M4 is coupled to the first voltage terminal V1. The first electrodes of the four fifth transistors (M5_1, M5_2, M5_3, and M5_4) are coupled to the blank pull-down signal terminal V2. The second electrodes of the four fifth transistors (M5_1, M5_2, M5_3, and M5_4) are coupled to the respective pull-down nodes (Q(n) to Q(n+3)). In this embodiment, the signal from the second blank control terminal CLC has an inverted voltage with respect to the signal from the blank control terminal CLA.

In the case where the blank control terminal CLA is provided with the high voltage level, the second blank control terminal CLC is provided with the low voltage level. Therefore, the fourth transistor M4 is enabled, such that the node P is at the high level. In this way, the four fifth transistors (M5_1, M5_2, M5_3, and M5_4) are disabled. When the blank control terminal CLA is provided with the low voltage level, the four fifth transistors (M5_1, M5_2, M5_3, and M5_4) are enabled, thereby providing the low voltage level from the blank pull-down signal terminal to the four pull-down nodes (Q(n) to Q(n+3)). On the other hand, at this time, the second blank control terminal CLC is provided with the high voltage level. Therefore, the fourth transistor M4 is disabled, and the first voltage from the first voltage terminal is not applied to the node P.

Figure 6:
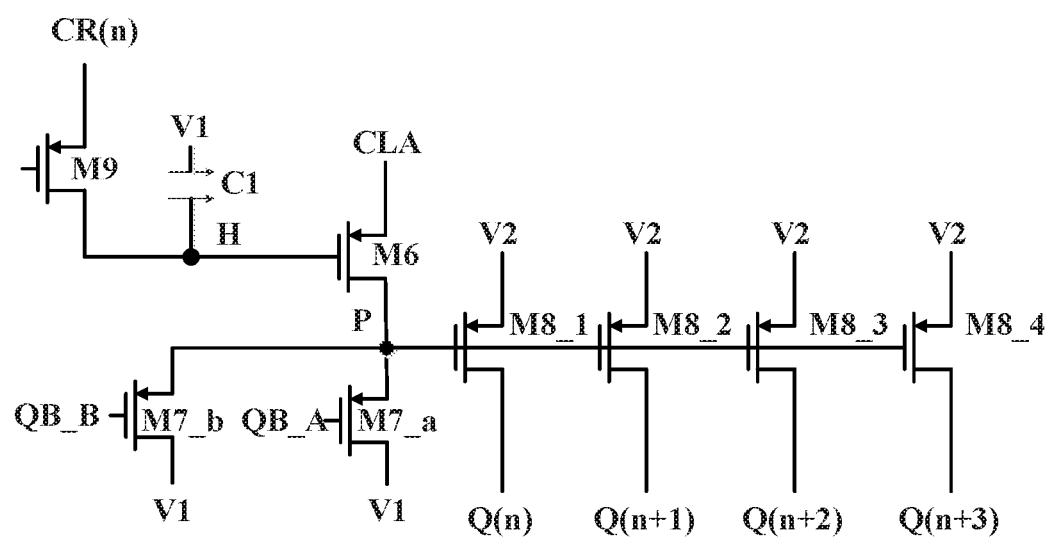
FIG. 6 is a schematic circuit diagram of a compensation selection circuit and a blanking input circuit of the shift register according to still another embodiment of the present disclosure.

FIG. 6 illustrates another exemplary structure of the isolation sub-circuit 122. As shown in FIG. 6, the isolation sub-circuit 122 may include a sixth transistor M6, two seventh transistors (M7_a and M7_b), and four eighth transistors (M8_1, M8_2, M8_3, and M8_4). A control electrode of the sixth transistor M6 is coupled to the pull-down control node H. A first electrode of the sixth transistor M6 is coupled to the blank control terminal CLA. A second electrode of the sixth transistor M6 is coupled to the second electrodes of the two seventh transistors (M7_a and M7_b) and the control electrodes of the four eighth transistors (M8_1, M8_2, M8_3, and M8_4). The control electrodes of the two seventh transistors (M7_a and M7_b) are respectively coupled to the third blank control terminal QB_A and the fourth blank control terminal QB_B. The signals from the third blank control terminal QB_A and the fourth blank control terminal QB_B enable the two seventh transistors (M7_a and M7_b) alternately. The first electrodes of the two seventh transistors (M7_a and M7_b) are coupled to the first voltage terminal V1. The first electrodes of the four eighth transistors (M8_1, M8_2, M8_3, and M8_4) are coupled to the blank pull-down signal terminal V2. The second electrodes of the four eighth transistors (M8_1, M8_2, M8_3, and M8_4) are coupled to the respective pull-down nodes (Q(n) to Q(n+3)).

When the blank control terminal CLA is provided with the high voltage level, the signals from the third blank control terminal QB_A and the fourth blank control terminal QB_B alternately enable the seventh transistors M7_a and M7_b. Therefore, node P is at high level. In this way, the four eighth transistors (M8_1, M8_2, M8_3, and M8_4) are disabled. When the blank control terminal CLA is provided with the low voltage level, the four eighth transistors (M8_1, M8_2, M8_3, and M8_4) are enabled, thereby providing the low voltage level from the blank pull-down signal terminal to the four pull-down nodes (Q(n) to Q(n+3)).

Returning to FIG. 2, in some embodiments of the present disclosure, the shift register circuit 130 may include a display input circuit 210, a display reset circuit 220, a blank reset circuit 230, a pull-up circuit 240, an output pull-up circuit 260, and an output circuit 250. The display input circuit 210 is configured to provide a display pull-down signal V2 to the pull-down node Q(n) based on a display input signal STU. The display reset circuit 220 is configured to reset the pull-down node Q(n) based on a display reset signal STD. The blank reset circuit 230 is configured to reset the pull-down node Q(n) based on a blank reset signal TRST. The pull-up circuit 240 is configured to maintain a voltage level of the pull-down node Q(n) after resetting the pull-down node Q(n), and alternately pull down the voltage levels of the first pull-up node and the second pull-up node (not shown). The output pull-up circuit 260 is configured to pull up a blank output signal and a display output signal OUT of the shift register based on the voltage levels of the first pull-up node and the second pull-up node. The output circuit 250 is configured to output the blank output signal OUT based on the blank pull-down signal V2 and the corresponding clock signal during a blank period, and output the display output signal OUT based on the display pull-down signal V2 and the corresponding clock signal during a display period.

Figure 7:
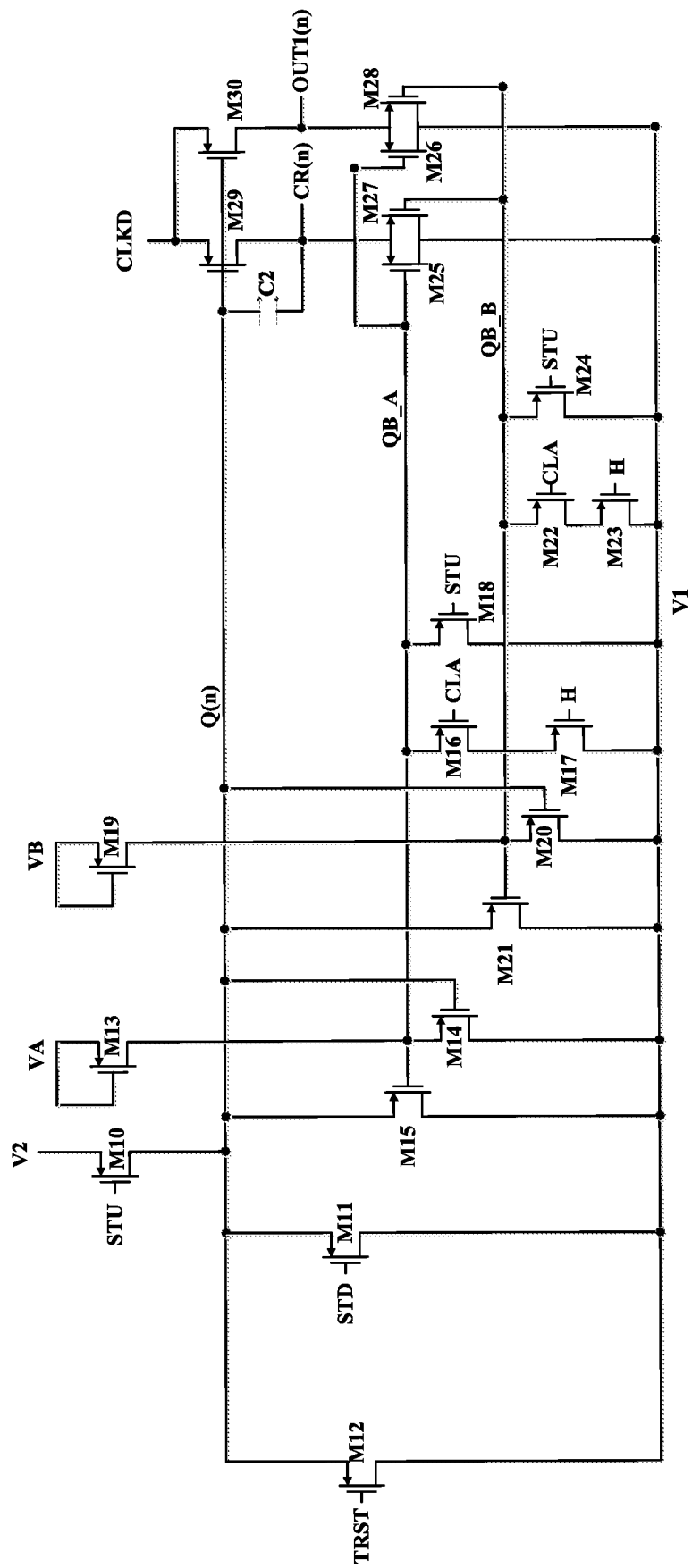
FIG. 7 is a schematic circuit diagram of a shift register circuit of the shift register according to an embodiment of the present disclosure.

FIG. 7 illustrates a schematic circuit diagram of the shift register circuit 130 of the shift register (100 and 200) according to an embodiment of the present disclosure. The display input circuit 210 includes a tenth transistor M10. A control electrode of the tenth transistor M10 is coupled to the display input signal STU. In a case where the shift register circuit 130 is at an $n^{th}$ stage in a gate drive circuit including a plurality of cascaded shift registers, the display input signal STU is, for example, the display output signal CR(n−2) of a shift register circuit at a $(n-2)^{th}$ row. A first electrode of the tenth transistor M10 is coupled to the display pull-down signal V2. A second electrode of the tenth transistor M10 is coupled to the pull-down node Q(n). The display reset circuit 220 includes an eleventh transistor M11. A control electrode of the eleventh transistor M11 is coupled to the display reset signal STD. In the case where the shift register circuit 130 is at the $n^{th}$ stage in the gate drive circuit including the plurality of cascaded shift registers, the display reset signal STD is, for example, a display output signal CR(n+3) of a shift register circuit at a $(n+3)^{th}$ row. A first electrode of the eleventh transistor M11 is coupled to the first voltage terminal V1. A second electrode of the eleventh transistor M11 is coupled to the pull-down node Q(n). The blank reset circuit 230 includes a twelfth transistor M12. A control electrode of the twelfth transistor M12 is coupled to the blank reset signal TRST. A first electrode of the twelfth transistor M12 is coupled to the first voltage terminal V1. A second electrode of the twelfth transistor M12 is coupled to the pull-down node Q(n). The pull-up circuit 240 includes a thirteenth transistor M13 to a twenty-fourth transistor M24. A control electrode and a first electrode of the thirteenth transistor M13 are coupled to the first control terminal VA. A second electrode of the thirteenth transistor M13 is coupled to the first pull-up node QB_A. A control electrode of the fourteenth transistor M14 is coupled to the pull-down node Q(n). A first electrode of the fourteenth transistor M14 is coupled to the first voltage terminal V1. A second electrode of the fourteenth transistor M14 is coupled to the first pull-up node QB_A. A control electrode of the fifteenth transistor M15 is coupled to the first pull-up node QB_A. A first electrode of the fifteenth transistor M15 is coupled to the first voltage terminal V1. A second electrode of the fifteenth transistor M15 is coupled to the pull-down node Q(n). A control electrode of the sixteenth transistor M16 is coupled to the blank control terminal CLA. A first electrode of the sixteenth transistor M16 is coupled to a second electrode of the seventeenth transistor M17. A second electrode of the sixteenth transistor M16 is coupled to the first pull-up node QB_A. A control electrode of the seventeenth transistor M17 is coupled to the pull-down control node H. A first electrode of the seventeenth transistor M17 is coupled to the first voltage terminal V1. A control electrode of the eighteenth transistor M18 is coupled to the display input terminal STU. A first electrode of the eighteenth transistor M18 is coupled to the first voltage terminal V1. A second electrode of the eighteenth transistor M18 is coupled to the first pull-up node QB_A. A control electrode and a first electrode of the nineteenth transistor M19 are coupled to the second control terminal VB. A second electrode of the nineteenth transistor M19 is coupled to the second pull-up node QB_B. A control electrode of the twentieth transistor M20 is coupled to the pull-down node Q(n). A first electrode of the twentieth transistor M20 is coupled to the first voltage terminal V1. A second electrode of the twentieth transistor M20 is coupled to the second pull-up node QB_B. A control electrode of the twenty-first transistor M21 is coupled to the second pull-up node QB_B. A first electrode of the twenty-first transistor M21 is coupled to the first voltage terminal V1. A second electrode of the twenty-first transistor M21 is coupled to the pull-down node Q(n). A control electrode of the twenty-second transistor M22 is coupled to the blank control terminal CLA. A first electrode of the twenty-second transistor M22 is coupled to a second electrode of the twenty-third transistor M23. A second electrode of the twenty-second transistor M22 is coupled to the second pull-up node QB_B. A control electrode of the twenty-third transistor M23 is coupled to the pull-down control node H. A first electrode of the twenty-third transistor M23 is coupled to the first voltage terminal V1. A control electrode of the twenty-fourth transistor M24 is coupled to the display input terminal STU. A first electrode of the twenty-fourth transistor M24 is coupled to the first voltage terminal V1. A second electrode of the twenty-fourth transistor M24 is coupled to the second pull-up node QB_B. The output pull-up circuit 260 includes a twenty-fifth transistor M25 to a twenty-eighth transistor M28. A control electrode of the twenty-fifth transistor M25 is coupled to the first pull-up node QB_A. A first electrode of the twenty-fifth transistor M25 is coupled to the first voltage terminal V1. A second electrode of the twenty-fifth transistor M25 is coupled to the shift signal output terminal CR(n). A control electrode of the twenty-sixth transistor M26 is coupled to the first pull-up node QB_A. A first electrode of the twenty-sixth transistor M26 is coupled to the first voltage terminal V1. A second electrode of the twenty-sixth transistor M26 is coupled to the first pixel signal output terminal OUT1(n). A control electrode of the twenty-seventh transistor M27 is coupled to the second pull-up node QB_B. A first electrode of the twenty-seventh transistor M27 is coupled to the first voltage terminal V1. A second electrode of the twenty-seventh transistor M27 is coupled to the shift signal output terminal CR(n). A control electrode of the twenty-eighth transistor M28 is coupled to the second pull-up node QB_B. A first electrode of the twenty-eighth transistor M28 is coupled to the first voltage terminal V1. A second electrode of the twenty-eighth transistor M28 is coupled to the first pixel signal output terminal OUT1(n). The output circuit 250 includes a twenty-ninth transistor M29, a thirtieth transistor M30, and a second capacitor C2. A control electrode of the twenty-ninth transistor M29 is coupled to the pull-down node Q(n). A first electrode of the twenty-ninth transistor M29 is coupled to the first clock signal terminal CLKD. A second electrode of the twenty-ninth transistor M29 is coupled to the shift signal output terminal CR(n). A control electrode of the thirtieth transistor M30 is coupled to the pull-down node Q(n). A first electrode of the thirtieth transistor M30 is coupled to the first clock signal terminal CLKD. A second electrode of the thirtieth transistor M30 is coupled to the first pixel signal output terminal OUT1(n).

Figure 8:
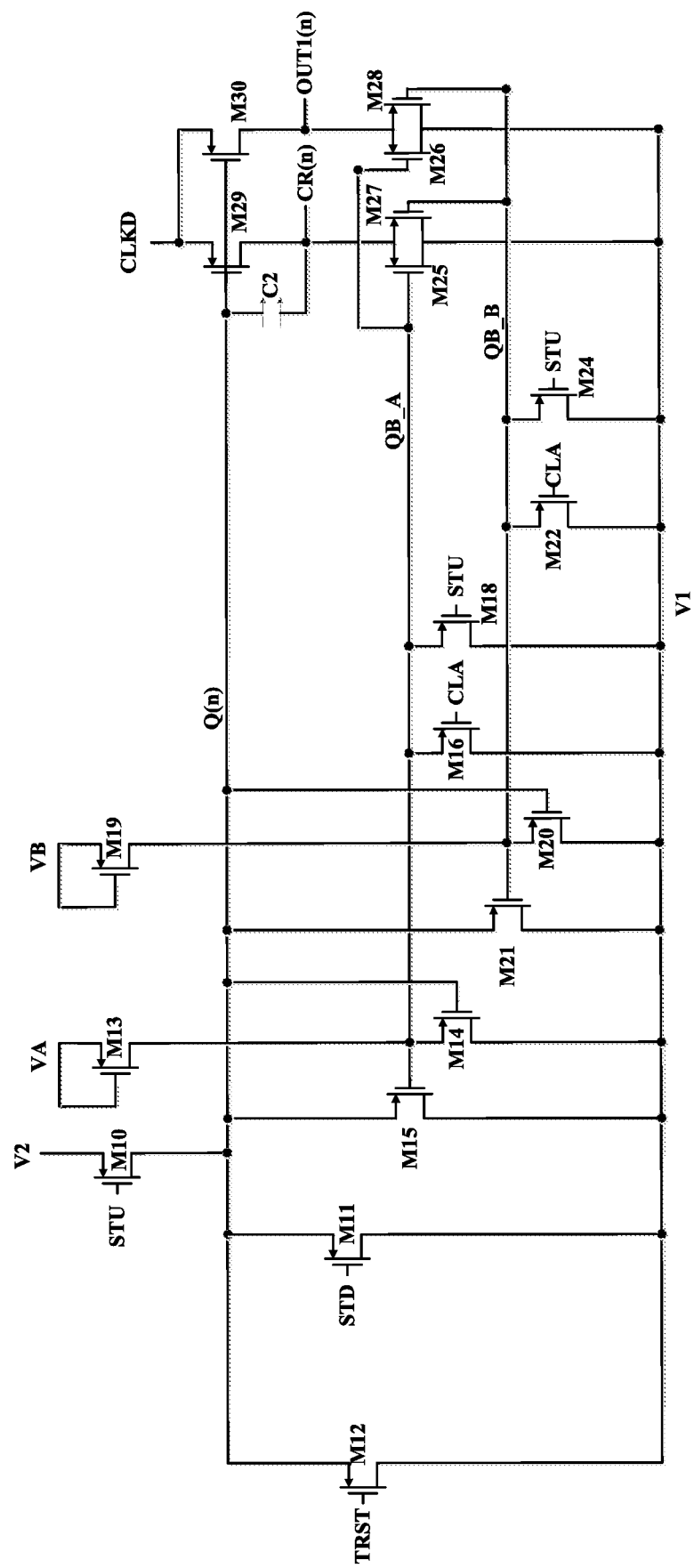
FIG. 8 is a schematic circuit diagram of a shift register circuit of the shift register according to another embodiment of the present disclosure.

FIG. 8 illustrates a schematic circuit diagram of the shift register circuit 130 of the shift register according to another embodiment of the present disclosure. The shift register circuit 130 shown in FIG. 8 is different from the shift register circuit 130 shown in FIG. 7 in that the seventeenth transistor M17 and the twenty-third transistor M23 are omitted, and the first electrode of the sixteenth transistor M16 and the first electrode of the twenty-second transistor M22 are directly connected to the first voltage terminal V1.

Figure 9:
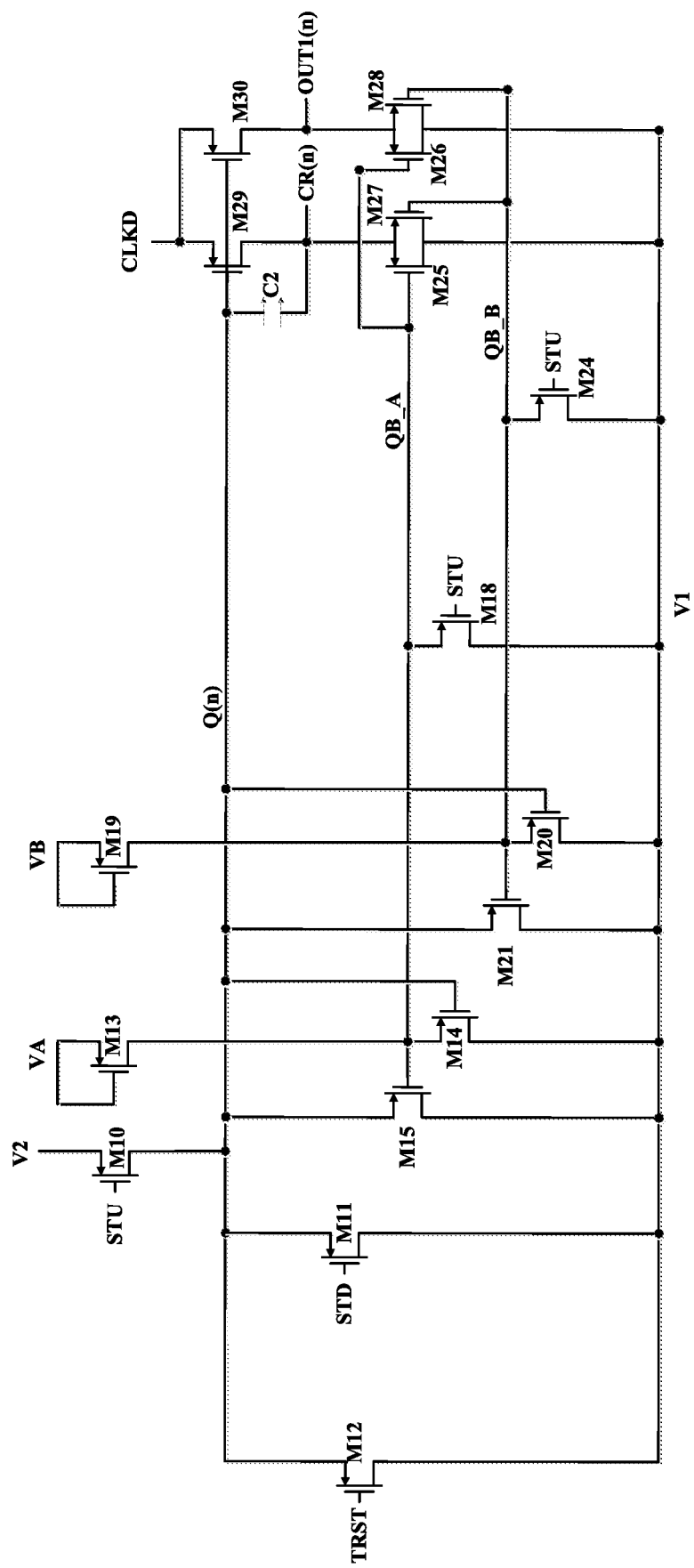
FIG. 9 is a schematic circuit diagram of a shift register circuit of the shift register according to still another embodiment of the present disclosure.

FIG. 9 illustrates a schematic circuit diagram of the shift register circuit 130 of the shift register according to still another embodiment of the present disclosure. The shift register circuit 130 shown in FIG. 9 is different from the shift register circuit 130 shown in FIG. 7 in that the sixteenth transistor M16, the seventeenth transistor M17, the twenty-second transistor M22, and the twenty-third transistor M23 is omitted.

Figure 10:
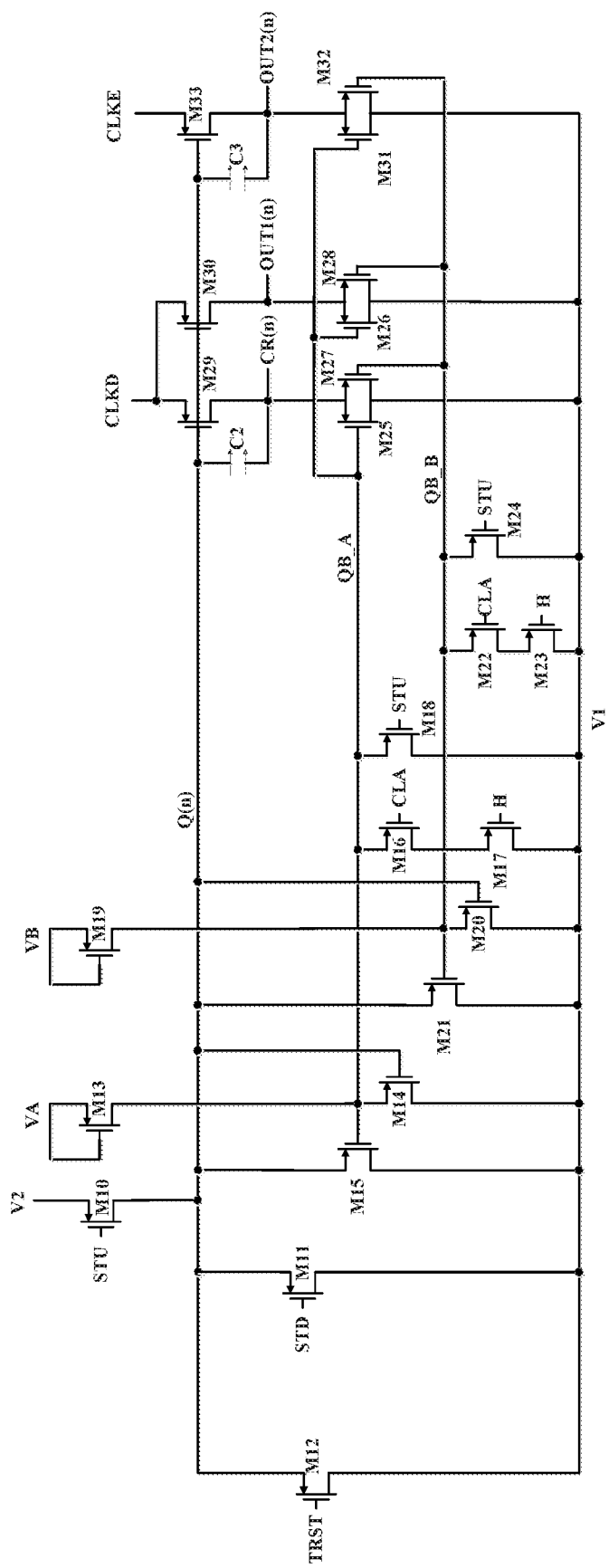
FIG. 10 is a schematic circuit diagram of a shift register circuit of the shift register according to still another embodiment of the present disclosure.

FIG. 10 illustrates a schematic circuit diagram of the shift register circuit 130 of the shift register according to still another embodiment of the present disclosure. In this embodiment, the output pull-up circuit 260 further includes a thirty-first transistor M31 and a thirty-second transistor M32. A control electrode of the thirty-first transistor M31 is coupled to the first pull-up node QB_A. A first electrode of the thirty-first transistor M31 is coupled to the first voltage terminal V1. A second electrode of the thirty-first transistor M31 is coupled to the second pixel signal output terminal OUT2(n). A control electrode of the thirty-second transistor M32 is coupled to the second pull-up node QB_B. A first electrode of the thirty-second transistor M32 is coupled to the first voltage terminal V1. A second electrode of the thirty-second transistor M32 is coupled to the second pixel signal output terminal OUT2(n). The output circuit 250 further includes a thirty-third transistor M33 and a third capacitor C3. A control electrode of the thirty-third transistor M33 is coupled to the pull-down node Q(n). A first electrode of the thirty-third transistor M33 is coupled to a second clock signal terminal CLKE. A second electrode of the thirty-third transistor M33 is coupled to the second pixel signal output terminal OUT2(n). A first terminal of the third capacitor C3 is coupled to the pull-down node Q(n). A second terminal of the third capacitor C3 is coupled to the second pixel signal output terminal OUT2(n). The second pixel signal output terminal OUT2(n) can output the second display output signal during the display period and output the second blank output signal during the blank period, under the control of the second clock signal terminal CLKE and the pull-down node Q(n).

For the shift register circuit 130 shown in FIGS. 7 to 10, in a case where the low voltage level is always outputted from the second control terminal VB, the thirteenth transistor M13 to the eighteenth transistor M18, the twenty-fifth transistor M25, the twenty-sixth transistor M26, and the thirty-first transistor M31 may be omitted. It is also possible to omit the nineteenth transistor M19 to the twenty-fourth transistor M24, the twenty-seventh transistor M27, the twenty-eighth transistor M28, and the thirty-second transistor M32, when the low voltage level is always outputted from the first control terminal VA.

Figure 11A:
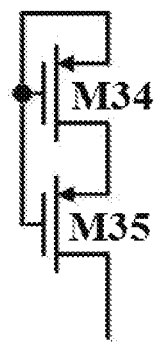
FIGS. 11A-11C are schematic circuit diagrams of a display input circuit of the shift register according to an embodiment of the present disclosure.
Figure 11B:
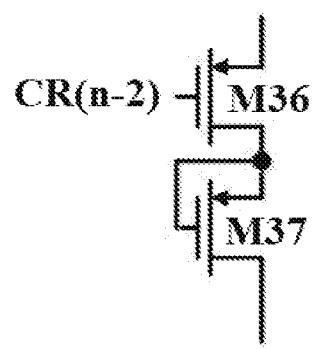
Figure 11C:
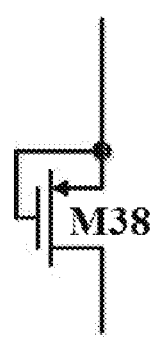

FIGS. 11A-11C are schematic circuit diagrams of the display input circuit 210 of the shift register according to an embodiment of the present disclosure. In the embodiment as shown in FIG. 11A, the display input circuit 210 includes a thirty-fourth transistor M34 and a thirty-fifth transistor M35. A control electrode and a first electrode of the thirty-fourth transistor M34 are coupled to the display input signal CR(n−2). A second electrode of the thirty-fourth transistor M34 is coupled to a first electrode of the thirty-fifth transistor M35. A control electrode of the thirty-fifth transistor M35 is coupled to the display input signal CR(n−2). A second electrode of the thirty-fifth transistor M35 is coupled to the pull-down node Q(n).

In the embodiment as shown in FIG. 11B, the display input circuit 210 includes a thirty-sixth transistor M36 and a thirty-seventh transistor M37. A control electrode of the thirty-sixth transistor M36 is coupled to the display input signal CR(n−2). A first electrode of the thirty-sixth transistor M36 is coupled to the display pull-down signal V2. A second electrode of the thirty-sixth transistor M36 is coupled to a control electrode and a first electrode of the thirty-seventh transistor M37. A second electrode of the thirty-seventh transistor M37 is coupled to the pull-down node Q(n).

In the embodiment as shown in FIG. 11C, the display input circuit 210 includes a thirty-eighth transistor M38. A control electrode and a first electrode of the thirty-eighth transistor M38 are coupled to the display input signal CR(n−2). A second electrode of the thirty-eighth transistor M38 is coupled to the pull-down node Q(n).

Figure 12:
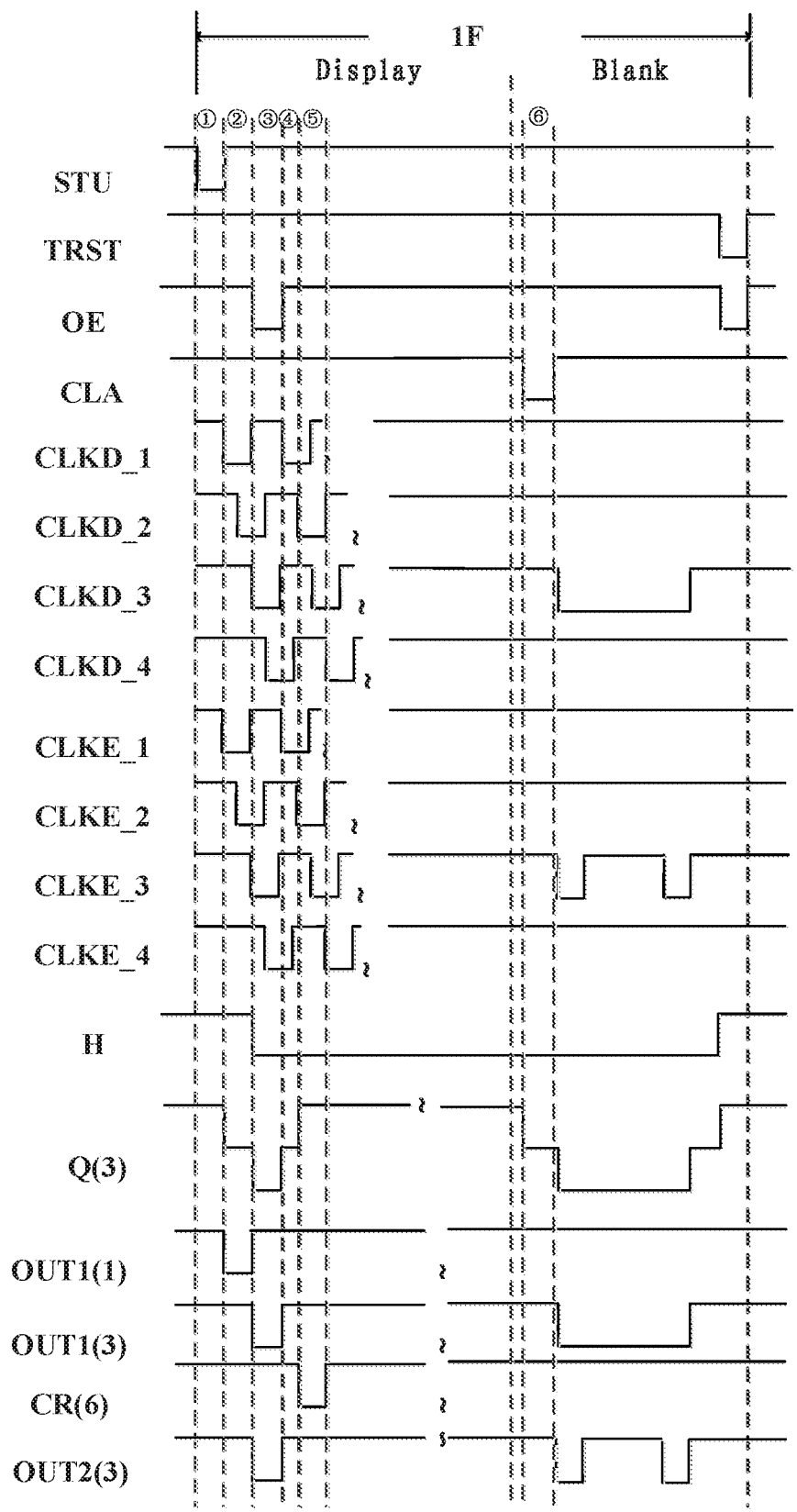
FIG. 12 is a timing diagram of some signals for the shift register as shown in FIG. 1 or FIG. 2.

FIG. 12 shows a timing diagram of some signals for the shift register (100 and 200) as shown in FIG. 1 or FIG. 2. The shift registers (100 and 200) as shown in FIG. 1 or FIG. 2 may be composed of, for example, the compensation selection circuit 110 and the blank input circuit 120 shown in FIG. 3 as well as the four shift register circuits 130 shown in FIG. 10. The following describes the working process of the compensation selection circuit 110 and the blank input circuit 120 as shown in FIG. 3 and the shift register circuit 130 as shown in FIG. 10 in detail, with reference to the timing diagram shown in FIG. 12. In the following description, it is assumed that all the transistors are P-type transistors. The first voltage V1 is at the high level. The second voltage V2 is at the low level. The low voltage levels are outputted alternately from the first control terminal VA and the second control terminal VB. The first clock signal terminal CLKD of the first shift register circuit provides a first clock signal CLKD_1. The first clock signal terminal CLKD of the second shift register circuit provides a second clock signal CLKD_2. The first clock signal terminal CLKD of the third shift register circuit provides a third clock signal CLKD_3. The first clock signal terminal CLKD of the fourth shift register circuit provides a fourth clock signal CLKD 4. The second clock signal terminal CLKE of the first shift register circuit provides a fifth clock signal CLKE_1. The second clock signal terminal CLKE of the second shift register circuit provides a sixth clock signal CLKE_2. The second clock signal terminal CLKE of the third shift register circuit provides a seventh clock signal CLKE_3. The second clock signal terminal CLKE of the fourth shift register circuit provides an eighth clock signal CLKE_4. The display input signal STU provided to the shift register circuit 130_1 at the first row and the shift register circuit 130_2 at the second row is at the low level in phase ①, and then at the high level. The display input signal STU provided to the shift register circuits 130_n at other rows is CR(n−2). The display reset signal STD provided to the shift register circuit 130_n at each row is CR(n+3). Here, n is the row number of the shift register circuit.

As shown in FIG. 12, phases ① to ⑤ belong to the display period, and phase ⑥ belongs to the blank period. Before the display period, the pull-down node Q(n) and the pull-down control node H are reset to the high voltage level by setting the blank reset signal TRST and the compensation selection control signal OE to the low voltage level.

For the shift register circuit 130_1 at the first row, in the phase ①, STU is at the low level, such that the tenth transistor M10 is enabled. Therefore, the display pull-down signal V2 is provided to the pull-down node Q(1), such that the pull-down node Q(1) is set to the low voltage level. Since the pull-down node Q(1) is at the low level, the fourteenth transistor M14 and the twentieth transistor M20 are enabled. Therefore, the first pull-up node QB_A(1) and the second pull-up node QB_B(1) are set to the high voltage level, such that the twenty-fifth transistor M25 to the twenty-eighth transistor M28 are disabled. In addition, since the pull-down node Q(1) is at the low level, the twenty-ninth transistor M29, the thirtieth transistor M30, and the thirty-third transistor M33 are enabled. Therefore, the high voltage level from the first clock signal CLKD_1 is outputted from the shift signal output terminal CR(1) and the first pixel signal output terminal OUT1(1), and the high voltage level from the fifth clock signal CLKE_1 is outputted from the second pixel signal output terminal OUT2(1).

In the phase ②, STU is at the high level, so the tenth transistor M10 is disabled. The voltage of the pull-down node Q(1) is maintained at the low level by the maintaining function of the second capacitor C2. Since the pull-down node Q(1) is at the low level, the twenty-ninth transistor M29, the thirtieth transistor M30, and the thirty-third transistor M33 continue to be enabled. Therefore, the low voltage level from the first clock signal CLKD_1 is outputted from the shift signal output terminal CR(1) and the first pixel signal output terminal OUT1(1), and the low voltage level from the fifth clock signal CLKE_1 is outputted from the second pixel signal output terminal OUT2(1). The potential of the pull-down node Q(1) is further pulled down due to the bootstrap effect.

In the phase ③, since the pull-down node Q(1) continues to be at the low level, the twenty-ninth transistor M29, the thirtieth transistor M30, and the thirty-third transistor M33 continue to be enabled. Therefore, the high voltage level from the first clock signal CLKD_1 is outputted from the shift signal output terminal CR(1) and the first pixel signal output terminal OUT1(1), and the high voltage level from the fifth clock signal CLKE_1 is outputted from the second pixel signal output terminal OUT2(1).

It can be seen from FIG. 12 that the display output signal OUT1(1) outputted from the first pixel signal output terminal OUT1(1) lags behind the display input signal STU by half of a clock period.

The operation of the shift register circuit 130_3 at the third row will be described in detail below with reference to FIG. 12. For the shift register circuit 130_3 at the third row, the display input signal is CR(1). CR(1) has the same waveform as OUT1(1). Therefore, in the phase ②, the tenth transistor M10 is enabled, such that the pull-down node Q(3) is set to the low voltage level. Since the pull-down node Q(3) is at the low level, the fourteenth transistor M14 and the twentieth transistor M20 are enabled. Therefore, the first pull-up node QB_A(3) and the second pull-up node QB_B(3) are set to the high voltage level, thereby disabling the twenty-fifth transistor M25 to the twenty-eighth transistor M28. In addition, since the pull-down node Q(3) is at the low level, the twenty-ninth transistor M29, the thirtieth transistor M30, and the thirty-third transistor M33 are enabled. Therefore, the high voltage level from the third clock signal CLKD_3 is outputted from the shift signal output terminal CR(3) and the first pixel signal output terminal OUT1(3), and the high voltage level from the seventh clock signal CLKE_3 is outputted from the second pixel signal output terminal OUT2(3).

In the phase ③, CR(1) is at the high level, so the tenth transistor M10 is disabled. The voltage of the pull-down node Q(3) is maintained at the low level by the maintaining function of the second capacitor C2. Since the pull-down node Q(3) is at the low level, the twenty-ninth transistor M29, the thirtieth transistor M30, and the thirty-third transistor M33 continue to be enabled. Therefore, the low voltage level from the third clock signal CLKD_3 is outputted from the shift signal output terminal CR(3) and the first pixel signal output terminal OUT1(3), and the low voltage level from the seventh clock signal CLKE_3 is outputted from the second pixel signal output terminal OUT2(3). The potential of the pull-down node Q(3) is further pulled down due to the bootstrap effect.

In addition, OE is at the low level at this phase, so the ninth transistor M9 is enabled. The pull-down control node H is provided with the low voltage level (i.e., a blank input signal) from the shift signal output terminal CR(3). The first capacitor C1 stores the blank input signal. Since the pull-down control node H is at the low level, the seventeenth transistor M17 and the twenty-third transistor M23 are enabled.

In the phase ④, since the pull-down node Q(3) continues to be at the low level, the twenty-ninth transistor M29, the thirtieth transistor M30, and the thirty-third transistor M33 continue to be enabled. Therefore, the high voltage level from the third clock signal CLKD_3 is outputted from the shift signal output terminal CR(3) and the first pixel signal output terminal OUT1(3), and the high voltage level from the seventh clock signal CLKE_3 is outputted from the second pixel signal output terminal OUT2(3). Due to the voltage difference between the both terminals of the second capacitor C2 should be constant, the potential of the pull-down node Q(3) will be raised by a corresponding amplitude.

In the phase ⑤, the display reset signal STD of the shift register circuit at the third row comes from the shift output terminal CR(6) of one shift register circuit of the other shift register. The low voltage level is outputted from the shift output terminal CR(6) at this phase. The voltage of pull-down node Q(3) is reset to the high voltage level. Therefore, the twenty-ninth transistor M29, the thirtieth transistor M30, the thirty-third transistor M33, the fourteenth transistor M14, and the twentieth transistor M20 are disabled. Since the low voltage levels are outputted alternately from the first control terminal VA and the second control terminal VB, the first pull-up node QB_A(3) and the second pull-up node QB_B(3) are alternately set to the low voltage level. In this case, the twenty-fifth transistor M25, the twenty-sixth transistor M26, the thirty-first transistor M31, and the twenty-seventh transistor M27, the twenty-eighth transistor M28, and the thirty-second transistor M32 are alternately enabled. Therefore, the high voltage levels are outputted from the shift signal output terminal CR(3), the first pixel signal output terminal OUT1(3), and the second pixel signal output terminal OUT2(3).

During the blank period, in the phase ⑥, the voltage of the pull-down control node H is maintained at the low level. Therefore, the first transistor M1 is enabled, thereby providing the low voltage level from the blank pull-down signal terminal to the node P. Since the low voltage level is outputted from the blank control terminal CLA, the second transistor M2, the sixteenth transistor M16, and the twenty-second transistor M22 are enabled. In the case where the second transistor M2 is enabled, the pull-down node Q(3) is set to the low voltage level. Therefore, the fourteenth transistor M14 and the twentieth transistor M20 are enabled, thereby setting the first pull-up node QB_A(3) and the second pull-up node QB_B(3) to the high voltage level. When the sixteenth transistor M16 and the twenty-second transistor M22 are enabled, the first pull-up node QB_A(3) and the second pull-up node QB_B(3) are also set to the high voltage level, thereby reducing the noise at first the pull-up node QB_A(3) and the second pull-up node QB_B(3). Since the first pull-up node QB_A(3) and the second pull-up node QB_B(3) are set to the high voltage level, the twenty-fifth transistor M25 to the twenty-eighth transistor M28, the thirty-first transistor M31, and the thirty-second transistors M32 are disabled, so they do not affect the output of the shift signal output terminal CR(3), the first pixel signal output terminal OUT1(3), and the second pixel signal output terminal OUT2(3).

At the later phase(s), the same signal as the third clock signal CLKD_3 is outputted from the shift signal output terminal CR(3) and the first pixel signal output terminal OUT1(3), as the blank output signal. The same signal as the seventh clock signal CLKE_3 is outputted from the second pixel signal output terminal OUT2(3), as another blank output signal.

Embodiments of the present disclosure also provide a drive method for driving any of the shift registers (100 and 200) as shown in FIGS. 1 and 2. In the drive method, during the display period, the blank input signal is provided to the blank input circuit 120 based on the compensation selection signal OE, and the blank input signal is stored in the blank input circuit 120. During the blank period, the blank pull-down signal V2 is provided to the N pull-down nodes (Q(1) to Q(N)) based on the stored blank input signal and blank control signal CLA, such that the N shift register circuits (130_1 to 130_N) output respective blank output signals based on the blank pull-down signal V2 and respective clock signals.

In some embodiments of the present disclosure, the drive method further includes during the display period, providing the display pull-down signal V2 to the respective pull-down nodes (Q(1) to Q(N)) based on the display input signal STU, and outputting respective display output signals based on voltage levels of the pull-down nodes(Q(1) to Q(N)) and the respective clock signals.

Figure 13:
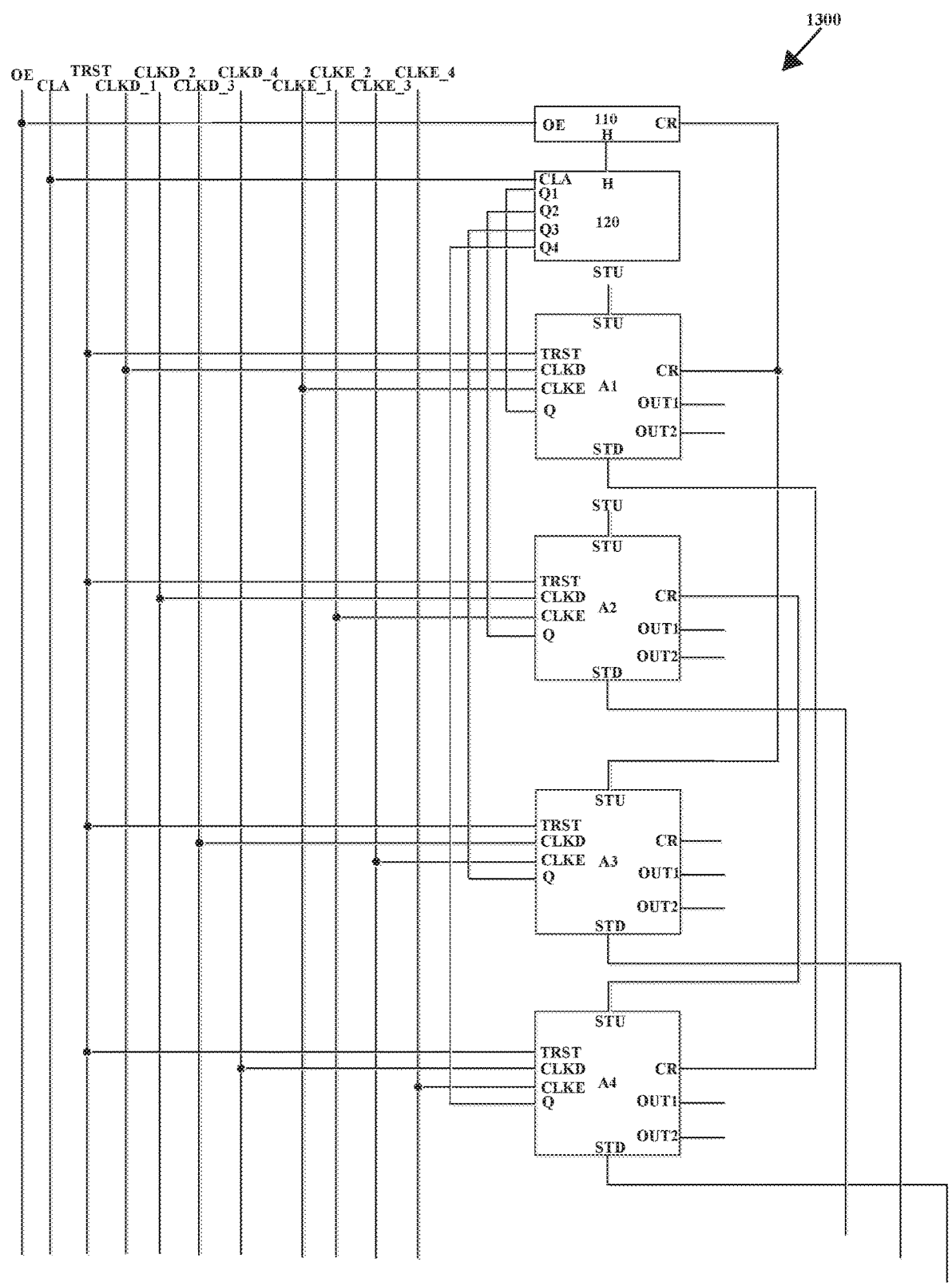
FIG. 13 is a schematic block diagram of a gate drive circuit according to an embodiment of the present disclosure.

FIG. 13 illustrates a schematic block diagram of a gate drive circuit 1300 according to an embodiment of the present disclosure. The gate drive circuit 1300 includes K (K is a natural number greater than 1) cascaded shift registers (100 and 200) according to the first aspect of the present disclosure. Therefore, it can be considered that the gate drive circuit 1300 includes K×N shift register circuits. A display input terminal of a first shift register circuit of the K×N shift register circuits is provided with a start signal. A display reset terminal of the first shift register circuit is coupled to a shift signal output terminal of a (i/2+2)$^{th}$ shift register circuit. A first clock signal terminal of the first shift register circuit is provided with a first clock signal. The display input terminal of the second shift register circuit is provided with the start signal. The display reset terminal of the second shift register circuit is coupled to the shift signal output terminal of a (i/2+3)$^{th}$ shift register circuit. A first clock signal terminal of the second shift register circuit is provided with a second clock signal. The display input terminal of an n$^{th}$ shift register circuit is coupled to the shift signal output terminal of a (n−i/2)$^{th}$ shift register circuit. The display reset terminal of the n$^{th}$ shift register circuit is coupled to the shift signal output terminal of a (n+i/2+1)$^{th}$ shift register circuit. The first clock signal terminal of the n$^{th}$ shift register circuit is provided with an M$^{th}$ clock signal.

During the display period, the gate drive circuit is provided with the first to an i$^{th}$ clock signals. The first to the i$^{th}$ clock signals have a same clock cycle, and the clock cycle comprises i phases with an equal duration, and the first to the i$^{th}$ clock signals are sequentially phase shifted by 1/i clock cycle. Here i is an even number. n is a natural number greater than 2 and less than or equal to K×N. If n equals to an integer multiple of i, M=i; otherwise, M=(n mod i).

In this embodiment, N and i are 4, for example. The shift register at each stage includes a compensation selection circuit 110, a blank input circuit 120, and four shift register circuits (A1-A4). The compensation selection control terminal OE of the shift register at each stage is provided with a respective compensation selection control signal OE, and the blank control terminal CLA of the shift register at each stage is provided with a respective blank control signal CLA. The display input terminal STU of the first shift register circuit A1 of the K×4 shift register circuits is coupled to the start signal STU. The display reset terminal STD of the first shift register circuit A1 is coupled to the shift signal output terminal CR(4) of the fourth shift register circuit A4. A first clock signal terminal CLKD of the first shift register circuit A1 is provided with a first clock signal CLKD_1. The display input terminal STU of the second shift register circuit A2 is coupled to the start signal STU. The display reset terminal STD of the second shift register circuit A2 is coupled to the shift signal output terminal CR(5) of the fifth shift register circuit (not shown). A first clock signal terminal CLKD of the second shift register circuit A2 is provided with a second clock signal CLKD_2. The display input terminal STU of the $n^{th}$ shift register circuit is coupled to the shift signal output terminal CR(n−2) of the (n−2)$^{th}$ shift register circuit. The display reset terminal STD of the $n^{th}$ shift register circuit is coupled to the shift signal output terminal CR(n+3) of the (n+3)$^{th}$ shift register circuit. The first clock signal terminal CLKD of the $n^{th}$ shift register circuit is provided with an $M^{th}$ clock signal CLKD_M. Here, n is a natural number greater than 2 and less than or equal to 2K. If n equals to an integer multiple of i, M=i; otherwise, M=(n mod i). For example, when n=4, M=4. When n=5, M=1. During the display period, the first to the fourth clock signals have a same clock cycle. The clock cycle includes four phases with an equal duration. And the first to fourth clock signals are sequentially phase shifted by ¼ clock cycle.

In some embodiments of the present disclosure, the second clock signal terminal CLKE of the $n^{th}$ shift register circuit is provided with the (i+M)$^{th}$ clock signal CLKE_M. During the display period, the (i+1)$^{th}$ to 2i$^{th}$ clock signals have the same waveforms as the first to i$^{th}$ clock signals, respectively.

Specifically, as shown in FIG. 13, the second clock signal terminal CLKE of the first shift register circuit A1 is provided with the fifth clock signal CLKE_1. The second clock signal terminal CLKE of the second shift register circuit A2 is provided with the sixth clock signal CLKE_2. The second clock signal terminal CLKE of the third shift register circuit A3 is provided with the seventh clock signal CLKE_3. The second clock signal terminal CLKE of the fourth shift register circuit A4 is provided with the eighth clock signal CLKE_4.

Figure 14:
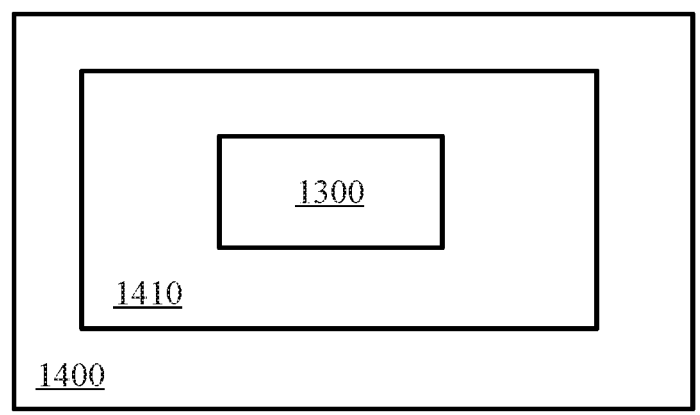
FIG. 14 is a schematic block diagram of a display device according to an embodiment of the present disclosure.

FIG. 14 illustrates a schematic block diagram of a display device 1400 according to an embodiment of the present disclosure. The display device 1400 includes an array substrate 1410. The array substrate 1410 includes the gate drive circuit 1300 as described above.

The display device 1400 provided by embodiments of the present disclosure can be applied to any product with a display function, for example, among others, electronic paper, mobile phone, tablet computer, television, notebook computer, digital photo frame, wearable device, or navigator.

As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted as inclusively rather than exclusively. Likewise, the terms "include" and "or" should be construed to be inclusive, unless such an interpretation is clearly prohibited from the context. Where used herein the term "examples," particularly when followed by a listing of terms is merely exemplary and illustrative, and should not be deemed to be exclusive or comprehensive.

Further adaptive aspects and scopes become apparent from the description provided herein. It should be understood that various aspects of the present disclosure may be implemented separately or in combination with one or more other aspects. It should also be understood that the description and specific embodiments in the present disclosure are intended to describe rather than limit the scope of the present disclosure.

A plurality of embodiments of the present disclosure has been described in detail above. However, apparently those skilled in the art may make various modifications and variations on the embodiments of the present disclosure without departing from the spirit and scope of the present disclosure. The scope of protecting of the present disclosure is limited by the appended claims.

What is claimed is:

1. A shift register comprising a blank input circuit, N shift register circuits, and a compensation selection circuit,
    wherein the blank input circuit is configured to store a blank input signal, and provide a blank pull-down signal to the N shift register circuits via N pull-down nodes of the N shift register circuits based on the blank input signal and a blank control signal;
    wherein the N shift register circuits are coupled to the blank input circuit, and are configured to output respective blank output signals based on the blank pull-down signal and respective clock signals during a blank period;
    wherein the compensation selection circuit is configured to provide the blank input signal to the blank input circuit under the control of a compensation selection control signal;
    wherein N is a natural number greater than 1; and
    wherein the N shift register circuits are further configured to output respective display output signals based on a display input signal and the respective clock signals during a display period, and wherein one of the display output signals is provided to the compensation selection circuit as the blank input signal.

2. The shift register according to claim 1, wherein the blank input circuit comprises a storage sub-circuit and an isolation sub-circuit,
    wherein the storage sub-circuit is configured to store the blank input signal; and
    wherein the isolation sub-circuit is configured to provide the blank pull-down signal to the N pull-down nodes based on the blank input signal and the blank control signal.

3. The shift register according to claim 2, wherein the isolation sub-circuit comprises a first transistor and N second transistors,
    wherein a control electrode of the first transistor is coupled to the storage sub-circuit, wherein a first electrode of the first transistor is coupled to a blank pull-down signal terminal, and wherein a second electrode of the first transistor is coupled to first electrodes of the N second transistors; and
    wherein control electrodes of the N second transistors are coupled to a blank control terminal, and wherein second electrodes of the N second transistors are coupled to the respective pull-down nodes.

4. The shift register according to claim 2, wherein the isolation sub-circuit comprises a third transistor, a fourth transistor, and N fifth transistors,
    wherein a control electrode of the third transistor is coupled to the storage sub-circuit, wherein a first electrode of the third transistor is coupled to the blank control terminal, and wherein a second electrode of the third transistor is coupled to a second electrode of the fourth transistor and control electrodes of the N fifth transistors;
    wherein a control electrode of the fourth transistor is coupled to a second blank control terminal, and wherein a first electrode of the fourth transistor is coupled to a first voltage terminal; and
    wherein first electrodes of the N fifth transistors are coupled to a blank pull-down signal terminal, and wherein second electrodes of the N fifth transistors are coupled to the respective pull-down nodes.

5. The shift register according to claim 2, wherein the isolation sub-circuit comprises a sixth transistor, two seventh transistors, and N eighth transistors, wherein a control electrode of the sixth transistor is coupled to the storage sub-circuit, wherein a first electrode of the sixth transistor is coupled to a blank control terminal, and wherein a second electrode of the sixth transistor is coupled to second electrodes of the two seventh transistors and control electrodes of the N eighth transistors;

wherein control electrodes of the two seventh transistors are respectively coupled to a third blank control terminal and a fourth blank control terminal, and wherein first electrodes of the two seventh transistors are coupled to a first voltage terminal; and wherein first electrodes of the N eighth transistors are coupled to a blank pull-down signal terminal, and wherein second electrodes of the N eighth transistors are coupled to the respective pull-down nodes.

6. The shift register according to claim 2, wherein the storage sub-circuit comprises a first capacitor, wherein a first terminal of the first capacitor is coupled to the compensation selection circuit and the isolation sub-circuit, and wherein a second terminal of the first capacitor is coupled to a first voltage terminal.

7. The shift register according to claim 1, wherein the compensation selection circuit comprises a ninth transistor, wherein a control electrode of the ninth transistor is coupled to a compensation selection control terminal, wherein a first electrode of the ninth transistor is coupled to a blank input signal terminal, and wherein a second electrode of the ninth transistor is coupled to the isolation sub-circuit.

8. The shift register according to claim 1, wherein each of the N shift register circuits comprises a display input circuit, a display reset circuit, a blank reset circuit, a pull-up circuit, an output pull-up circuit, and an output circuit, wherein in each of the N shift register circuits the display input circuit is configured to provide a display pull-down signal to a pull-down node of the shift register circuit based on a display input signal;

wherein in each of the N shift register circuits the display reset circuit is configured to reset the pull-down node of the shift register circuit based on a display reset signal;

wherein in each of the N shift register circuits the blank reset circuit is configured to reset the pull-down node of the shift register circuit based on a blank reset signal;

wherein in each of the N shift register circuits the pull-up circuit is configured to maintain a voltage level of the pull-down node of the shift register circuit after resetting the pull-down node of the shift register circuit, and alternately pull down voltage levels of the first pull-up node and the second pull-up node;

wherein in each of the N shift register circuits the output pull-up circuit is configured to pull up a blank output signal and a display output signal of the shift register based on the voltage levels of the first pull-up node and the second pull-up node; and wherein in each of the N shift register circuits the output circuit is configured to output the blank output signal based on the blank pull-down signal and the corresponding clock signal during the blank period, and output the display output signal based on the display pull-down signal and the corresponding clock signal during the display period.

9. The shift register according to claim 8, wherein the display reset circuit comprises an eleventh transistor, wherein a control electrode of the eleventh transistor is coupled to a display reset terminal, wherein a first electrode of the eleventh transistor is coupled to a first voltage terminal, and wherein a second electrode of the eleventh transistor is coupled to the pull-down node of the shift register circuit.

10. The shift register according to claim 8, wherein the blank reset circuit comprises a twelfth transistor, wherein a control electrode of the twelfth transistor is coupled to a blank reset terminal, wherein a first electrode of the twelfth transistor is coupled to a first voltage terminal, and wherein a second electrode of the twelfth transistor is coupled to the pull-down node of the shift register circuit.

11. The shift register according to claim 8, wherein the pull-up circuit comprises thirteenth to twenty-fourth transistors, wherein a control electrode and a first electrode of the thirteenth transistor are coupled to the first control terminal, wherein a second electrode of the thirteenth transistor is coupled to a first pull-up node, wherein a control electrode of the fourteenth transistor is coupled to the pull-down node of the shift register circuit, wherein a first electrode of the fourteenth transistor is coupled to a first voltage terminal, wherein a second electrode of the fourteenth transistor is coupled to the first pull-up node, wherein a control electrode of the fifteenth transistor is coupled to the first pull-up node, wherein a first electrode of the fifteenth transistor is coupled to the first voltage terminal, wherein a second electrode of the fifteenth transistor is coupled to the pull-down node of the shift register circuit, wherein a control electrode of the sixteenth transistor is coupled to a blank control terminal, wherein a first electrode of the sixteenth transistor is coupled to a second electrode of the seventeenth transistor, wherein a second electrode of the sixteenth transistor is coupled to the first pull-up node, wherein a control electrode of the seventeenth transistor is coupled to a pull-down control node, wherein a first electrode of the seventeenth transistor is coupled to the first voltage terminal, wherein a control electrode of the eighteenth transistor is coupled to a display input terminal, wherein a first electrode of the eighteenth transistor is coupled to the first voltage terminal, wherein a second electrode of the eighteenth transistor is coupled to the first pull-up node, wherein a control electrode and a first electrode of the nineteenth transistor are coupled to a second control terminal, wherein a second electrode of the nineteenth transistor is coupled to a second pull-up node, wherein a control electrode of the twentieth transistor is coupled to the pull-down node of the shift register circuit, wherein a first electrode of the twentieth transistor is coupled to the first voltage terminal, wherein a second electrode of the twentieth transistor is coupled to the second pull-up node, wherein a control electrode of the twenty-first transistor is coupled to the second pull-up node, wherein a first electrode of the twenty-first transistor is coupled to the first voltage terminal, wherein a second electrode of the twenty-first transistor is coupled to the pull-down node of the shift register circuit, wherein a control electrode of the twenty-second transistor is coupled to the blank control terminal, wherein a first electrode of the twenty-second transistor is coupled to a second electrode of the twenty-third transistor, wherein a second electrode of the twenty-second transistor is coupled to the second pull-up node, wherein a control electrode of a twenty-third transistor is coupled to the pull-down control node, wherein a first electrode of the twenty-third transistor is coupled to the first voltage terminal, wherein a control electrode of the twenty-fourth transistor is coupled to the display input terminal, wherein a first electrode of the twenty-fourth transistor is coupled to the first voltage terminal, and wherein a second electrode of the twenty-fourth transistor is coupled to the second pull-up node; or wherein the pull-up circuit comprises thirteenth to sixteenth transistors, eighteenth to twenty-second transistors, and a twenty-fourth transistor, wherein a control electrode and a first electrode of the thirteenth transistor are coupled to a first control terminal, wherein a second electrode of the thirteenth transistor is coupled to a first pull-up node, wherein a control electrode of the fourteenth transistor is coupled to the pull-down node of the shift register circuit, wherein a first electrode of the fourteenth transistor is coupled to the first voltage terminal, wherein a second electrode of the fourteenth transistor is coupled to the first pull-up node, wherein a control electrode of the fifteenth transistor is coupled to the first pull-up node, wherein a first electrode of the fifteenth transistor is coupled to the first voltage terminal, wherein a second electrode of the fifteenth transistor is coupled to the pull-down node of the shift register circuit, wherein a control electrode of the sixteenth transistor is coupled to the blank control terminal, wherein a first electrode of the sixteenth transistor is coupled to the first voltage terminal, wherein a second electrode of the sixteenth transistor is coupled to the first pull-up node, wherein a control electrode of the eighteenth transistor is coupled to the display input terminal, wherein a first electrode of the eighteenth transistor is coupled to the first voltage terminal, wherein a second electrode of the eighteenth transistor is coupled to the first pull-up node, wherein a control electrode and a first electrode of the nineteenth transistor are coupled to a second control terminal, wherein a second electrode of the nineteenth transistor is coupled to a second pull-up node, wherein a control electrode of the twentieth transistor is coupled to the pull-down node of the shift register circuit, wherein a first electrode of the twentieth transistor is coupled to the first voltage terminal, wherein a second electrode of the twentieth transistor is coupled to the second pull-up node, wherein a control electrode of the twenty-first transistor is coupled to the second pull-up node, wherein a first electrode of the twenty-first transistor is coupled to the first voltage terminal, wherein a second electrode of the twenty-first transistor is coupled to the pull-down node of the shift register circuit, wherein a control electrode of the twenty-second transistor is coupled to the blank control terminal, wherein a first electrode of the twenty-second transistor is coupled to the first voltage terminal, wherein a second electrode of the twenty-second transistor is coupled to the second pull-up node, wherein a control electrode of the twenty-fourth transistor is coupled to the display input terminal, wherein a first electrode of the twenty-fourth transistor is coupled to the first voltage terminal, and wherein a second electrode of the twenty-fourth transistor is coupled to the second pull-up node; or wherein the pull-up circuit comprises thirteenth to fifteenth transistors, eighteenth to twenty-first transistors, and a twenty-fourth transistor, wherein a control electrode and a first electrode of the thirteenth transistor are coupled to a first control terminal, wherein a second electrode of the thirteenth transistor is coupled to a first pull-up node, wherein a control electrode of the fourteenth transistor is coupled to the pull-down node of the shift register circuit, wherein a first electrode of the fourteenth transistor is coupled to the first pull-up node, wherein a second electrode of the fourteenth transistor is coupled to the first pull-up node, wherein a control electrode of the fifteenth transistor is coupled to the first pull-up node, wherein a first electrode of the fifteenth transistor is coupled to the first voltage terminal, wherein a second electrode of the fifteenth transistor is coupled to the pull-down node of the shift register circuit, wherein a control electrode of the eighteenth transistor is coupled to the display input terminal, wherein a first electrode of the eighteenth transistor is coupled to the first voltage terminal, wherein a second electrode of the eighteenth transistor is coupled to the first pull-up node, wherein a control electrode and a first electrode of the nineteenth transistor are coupled to a second control terminal, wherein a second electrode of the nineteenth transistor is coupled to a second pull-up node, wherein a control electrode of the twentieth transistor is coupled to the pull-down node of the shift register circuit, wherein a first electrode of the twentieth transistor is coupled to the first voltage terminal, wherein a second electrode of the twentieth transistor is coupled to the second pull-up node, wherein a control electrode of a twenty-first transistor is coupled to the second pull-up node, wherein a first electrode of the twenty-first transistor is coupled to the first voltage terminal, wherein a second electrode of the twenty-first transistor is coupled to the pull-down node of the shift register circuit, wherein a control electrode of the twenty-fourth transistor is coupled to the display input terminal, wherein a first electrode of the twenty-fourth transistor is coupled to the first voltage terminal, and wherein a second electrode of the twenty-fourth transistor is coupled to the second pull-up node.

12. The shift register according to claim 8, wherein the output pull-up circuit comprises twenty-fifth to twenty-eighth transistors, wherein a control electrode of the twenty-fifth transistor is coupled to the first pull-up node, wherein a first electrode of the twenty-fifth transistor is coupled to a first voltage terminal, wherein a second electrode of the twenty-fifth transistor is coupled to a shift signal output terminal, wherein a control electrode of the twenty-sixth transistor is coupled to the first pull-up node, wherein a first electrode of the twenty-sixth transistor is coupled to the first voltage terminal, wherein a second electrode of the twenty-sixth transistor is coupled to a first pixel signal output terminal, wherein a control electrode of the twenty-seventh transistor is coupled to the second pull-up node, wherein a first electrode of the twenty-seventh transistor is coupled to the first voltage terminal, wherein a second electrode of the twenty-seventh transistor is coupled to the shift signal output terminal, wherein a control electrode of the twenty-eighth transistor is coupled to the second pull-up node, wherein a first electrode of the twenty-eighth transistor is coupled to the first voltage terminal, and wherein a second electrode of the twenty-eighth transistor is coupled to the first pixel signal output terminal; and wherein the output circuit comprises a twenty-ninth transistor, a thirtieth transistor, and a second capacitor, wherein a control electrode of the twenty-ninth transistor is coupled to the pull-down node of the shift register circuit, wherein a first electrode of the twenty-ninth transistor is coupled to a first clock signal terminal, wherein a second electrode of the twenty-ninth transistor is coupled to the shift signal output terminal, wherein a control electrode of the thirtieth transistor is coupled to the pull-down node of the shift register circuit, wherein a first electrode of the thirtieth transistor is coupled to the first clock signal terminal, and wherein a second electrode of the thirtieth transistor is coupled to the first pixel signal output terminal.

13. The shift register according to claim 12, wherein the output pull-up circuit further comprises a thirty-first transistor and a thirty-second transistor, wherein a control electrode of the thirty-first transistor is coupled to the first pull-up node, wherein a first electrode of the thirty-first transistor is coupled to the first voltage terminal, wherein a second electrode of the thirty-first transistor is coupled to a second pixel signal output terminal, wherein a control electrode of thirty-second transistor is coupled to the second pull-up node, wherein a first electrode of the thirty-second transistor is coupled to the first voltage terminal, and wherein a second electrode of the thirty-second transistor is coupled to the second pixel signal output terminal; and wherein the output circuit further comprises a thirty-third transistor and a third capacitor, wherein a control electrode of the thirty-third transistor is coupled to the pull-down node of the shift register circuit, wherein a first electrode of the thirty-third transistor is coupled to a second clock signal terminal, wherein a second electrode of the thirty-third transistor is coupled to the second pixel signal output terminal, wherein a first terminal of the third capacitor is coupled to the pull-down node of the shift register circuit, and wherein a second terminal of the third capacitor is coupled to the second pixel signal output terminal.

14. The shift register according to claim 8, wherein the display input circuit comprises a tenth transistor, wherein a control electrode of the tenth transistor is coupled to a display input terminal, wherein a first electrode of the tenth transistor is coupled to a display pull-down signal terminal, and wherein a second electrode of the tenth transistor is coupled to the pull-down node of the shift register circuit; or wherein the display input circuit comprises a thirty-fourth transistor and a thirty-fifth transistor, wherein a control electrode of the thirty-fourth transistor and a first electrode of the thirty-fourth transistor are coupled to the display input terminal, wherein a second electrode of the thirty-fourth transistor is coupled to a first electrode of the thirty-fifth transistor, wherein a control electrode of the thirty-fifth transistor is coupled to the display input terminal, and wherein a second electrode of the thirty-fifth transistor is coupled to the pull-down node of the shift register circuit; or wherein the display input circuit comprises a thirty-sixth transistor and a thirty-seventh transistor, wherein a control electrode of the thirty-sixth transistor is coupled to the display input terminal, wherein a first electrode of the thirty-sixth transistor is coupled to the display pull-down signal terminal, wherein a second electrode of the thirty-sixth transistor is coupled to a control electrode and a first electrode of the thirty-seventh transistor, and wherein a second electrode of the thirty-seventh transistor is coupled to the pull-down node of the shift register circuit; or wherein the display input circuit comprises a thirty-eighth transistor, wherein a control electrode and a first electrode of the thirty-eighth transistor are coupled to the display input terminal, and wherein a second electrode of the thirty-eighth transistor is coupled to the pull-down node of the shift register circuit.

15. A gate drive circuit comprising K cascaded shift registers, each of the K cascaded shift registers being the shift register according to claim 1, wherein a compensation selection control terminal of each of the K cascaded shift registers is provided with a compensation selection control signal, and wherein a blank control terminal of each of the K cascaded shift registers is provided with a blank control signal, wherein a display input terminal of a first shift register circuit of K×N shift register circuits is provided with a start signal, wherein a display reset terminal of the first shift register circuit is coupled to a shift signal output terminal of a $(i/2+2)^{th}$ shift register circuit, and wherein a first clock signal terminal of the first shift register circuit is provided with a first clock signal;

wherein the display input terminal of a second shift register circuit is provided with the start signal, wherein the display reset terminal of the second shift register circuit is coupled to the shift signal output terminal of a $(i/2+3)^{th}$ shift register circuit, and wherein the first clock signal terminal of the second shift register circuit is provided with a second clock signal;

wherein the display input terminal of an $n^{th}$ shift register circuit is coupled to the shift signal output terminal of a $(n-i/2)^{th}$ shift register circuit, wherein the display reset terminal of the $n^{th}$ shift register circuit is coupled to the shift signal output terminal of a $(n+i/2+1)^{th}$ shift register circuit, and wherein the first clock signal terminal of the $n^{th}$ shift register circuit is provided with an $M^{th}$ clock signal; and wherein during a display period, the gate drive circuit is provided with a first to an $i^{th}$ clock signals, the first to the $i^{th}$ clock signals have a same clock cycle, and the clock cycle comprises i phases with an equal duration, and the first to the $i^{th}$ clock signals are sequentially phase shifted by 1/i clock cycle, wherein i is an even number, wherein K is a natural number greater than 1, n is a natural number greater than 2 and less than or equal to K×N, and wherein if n equals to an integer multiple of i, M=i; otherwise, M=(n mod i).

16. The gate drive circuit according to claim 15, wherein N equals four, and/or i equals 4.

17. The gate drive circuit according to claim 15, wherein a second clock signal terminal of the $n^{th}$ shift register circuit is provided with a $(i+M)^{th}$ clock signal; and wherein during the display period, the $(i+1)^{th}$ to $2i^{th}$ clock signals have the same waveforms as the first to $i^{th}$ clock signals respectively.

18. A drive method for driving a shift register according to claim 1, the drive method comprising:

providing, during a display period, the blank input signal to the blank input circuit based on a compensation selection signal, and storing the blank input signal in the blank input circuit; and providing, during a blank period, a blank pull-down signal to the N pull-down nodes based on the stored blank input signal and a blank control signal, such that the N shift register circuits output respective blank output signals based on the blank pull-down signal and respective clock signals.

19. The drive method according to claim 18, further comprising, during the display period, providing a display pull-down signal to each of the N pull-down nodes based on a display input signal; and outputting respective display output signals based on voltage levels of the pull-down nodes and the respective clock signals.

* * * * *

UNITED STATES PATENT AND TRADEMARK OFFICE
CERTIFICATE OF CORRECTION

| | |
|---|---|
| PATENT NO. | : 11,328,651 B2 |
| APPLICATION NO. | : 16/643966 |
| DATED | : May 10, 2022 |
| INVENTOR(S) | : Xuehuan Feng et al. |

It is certified that error appears in the above-identified patent and that said Letters Patent is hereby corrected as shown below:

On the Title Page

In item (54), in Title, delete "SUB-PIXLE" and insert therefor -- SUB-PIXEL --.

In the Specification

Column 1, Line 2, delete "SUB-PIXLE" and insert therefor -- SUB-PIXEL --.

Signed and Sealed this
Twenty-third Day of August, 2022

Katherine Kelly Vidal
*Director of the United States Patent and Trademark Office*